United States Patent
Nishizawa

(10) Patent No.: US 9,455,676 B2
(45) Date of Patent: Sep. 27, 2016

(54) SEMICONDUCTOR CIRCUIT AND AMPLIFIER CIRCUIT

(71) Applicant: MegaChips Corporation, Osaka-shi (JP)

(72) Inventor: Yuuki Nishizawa, Funabashi (JP)

(73) Assignee: MegaChips Corporation, Osaka-shi (JP)

( * ) Notice: Subject to any disclaimer, the term of this patent is extended or adjusted under 35 U.S.C. 154(b) by 0 days.

(21) Appl. No.: 14/665,374

(22) Filed: Mar. 23, 2015

(65) Prior Publication Data

US 2015/0280663 A1 Oct. 1, 2015

(30) Foreign Application Priority Data

Mar. 31, 2014 (JP) .................................. 2014-070950

(51) Int. Cl.
*H03F 1/14* (2006.01)
*H03F 3/45* (2006.01)

(52) U.S. Cl.
CPC ............ *H03F 3/45076* (2013.01); *H03F 1/14* (2013.01); *H03F 3/45192* (2013.01); *H03F 3/45475* (2013.01); *H03F 3/45632* (2013.01); *H03F 2200/135* (2013.01); *H03F 2200/153* (2013.01); *H03F 2203/45052* (2013.01); *H03F 2203/45264* (2013.01)

(58) Field of Classification Search
CPC .................................... H03F 1/14; H03F 3/45
USPC .................... 330/292, 261, 260, 69
See application file for complete search history.

(56) References Cited

U.S. PATENT DOCUMENTS

| 7,397,307 | B2* | 7/2008 | Stoger | ....................... H03F 1/34 330/254 |
| 7,671,683 | B2 | 3/2010 | Agawa | |
| 8,264,277 | B2* | 9/2012 | Igarashi | ............. H03F 3/45192 330/253 |
| 8,791,752 | B2* | 7/2014 | Nicollini | ............... H03F 3/3028 327/562 |
| 2011/0148523 | A1* | 6/2011 | Deng | ..................... H03F 3/005 330/253 |
| 2014/0077878 | A1* | 3/2014 | Hsieh | ..................... H03F 1/223 330/254 |

FOREIGN PATENT DOCUMENTS

| JP | 2008-228029 | 9/2008 |
| JP | 2009-246780 | 10/2009 |
| JP | 2009-246985 | 10/2009 |

* cited by examiner

*Primary Examiner* — Henry Choe
(74) *Attorney, Agent, or Firm* — Oblon, McClelland, Maier & Neustadt, L.L.P.

(57) ABSTRACT

An amplifier circuit outputs a control signal for controlling a control target circuit and receives input of a feedback signal from the control target circuit. The amplifier circuit and the control target circuit constitute a feedback loop that includes a plurality of poles. A semiconductor capacitive element is provided for phase compensation in the feedback loop. The amplifier circuit includes an output branch that includes a first transistor having a first current terminal from which the control signal is output and a second current terminal connected to a power supply potential, and a branch that is connected in parallel to the output branch and includes a cascode circuit. The cascode circuit includes a second transistor having third and fourth current terminals, and a third transistor having fifth and sixth current terminals. The fourth and fifth current terminals are connected to each other. The semiconductor capacitive element that obtains the Miller effect is connected between the control target circuit and the fourth and fifth current terminals.

8 Claims, 15 Drawing Sheets

F I G. 7
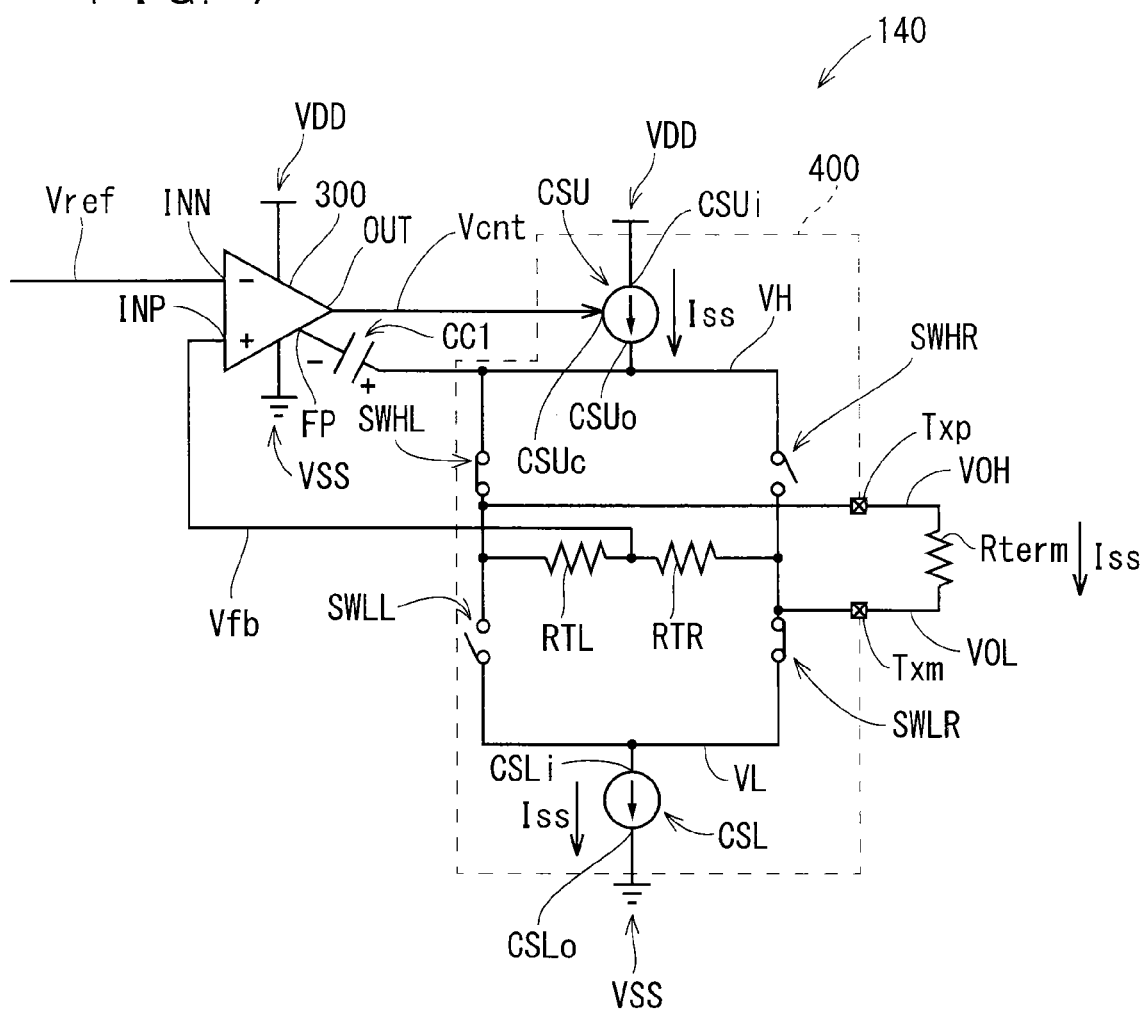

F I G. 1 1
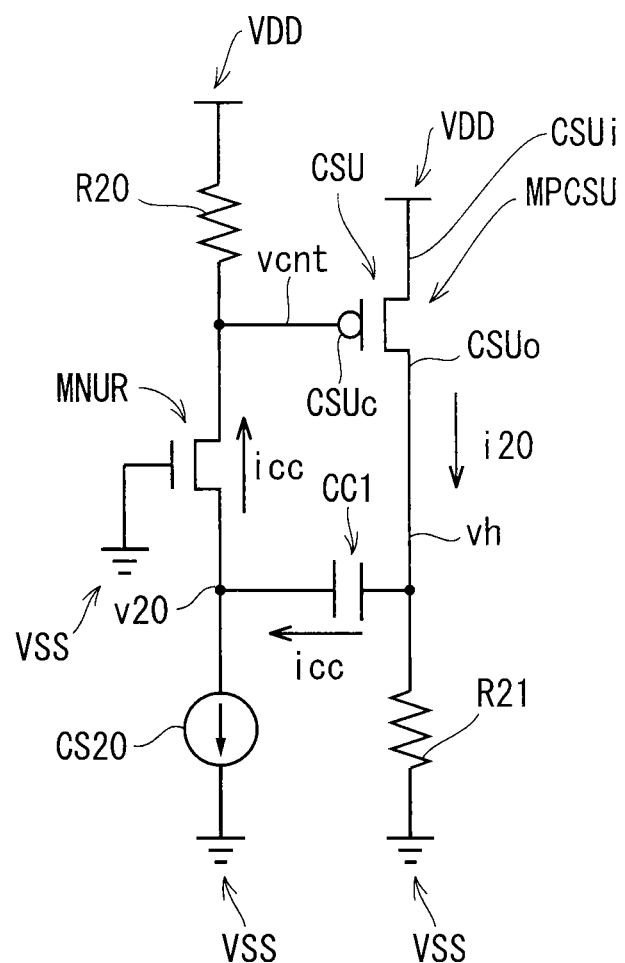

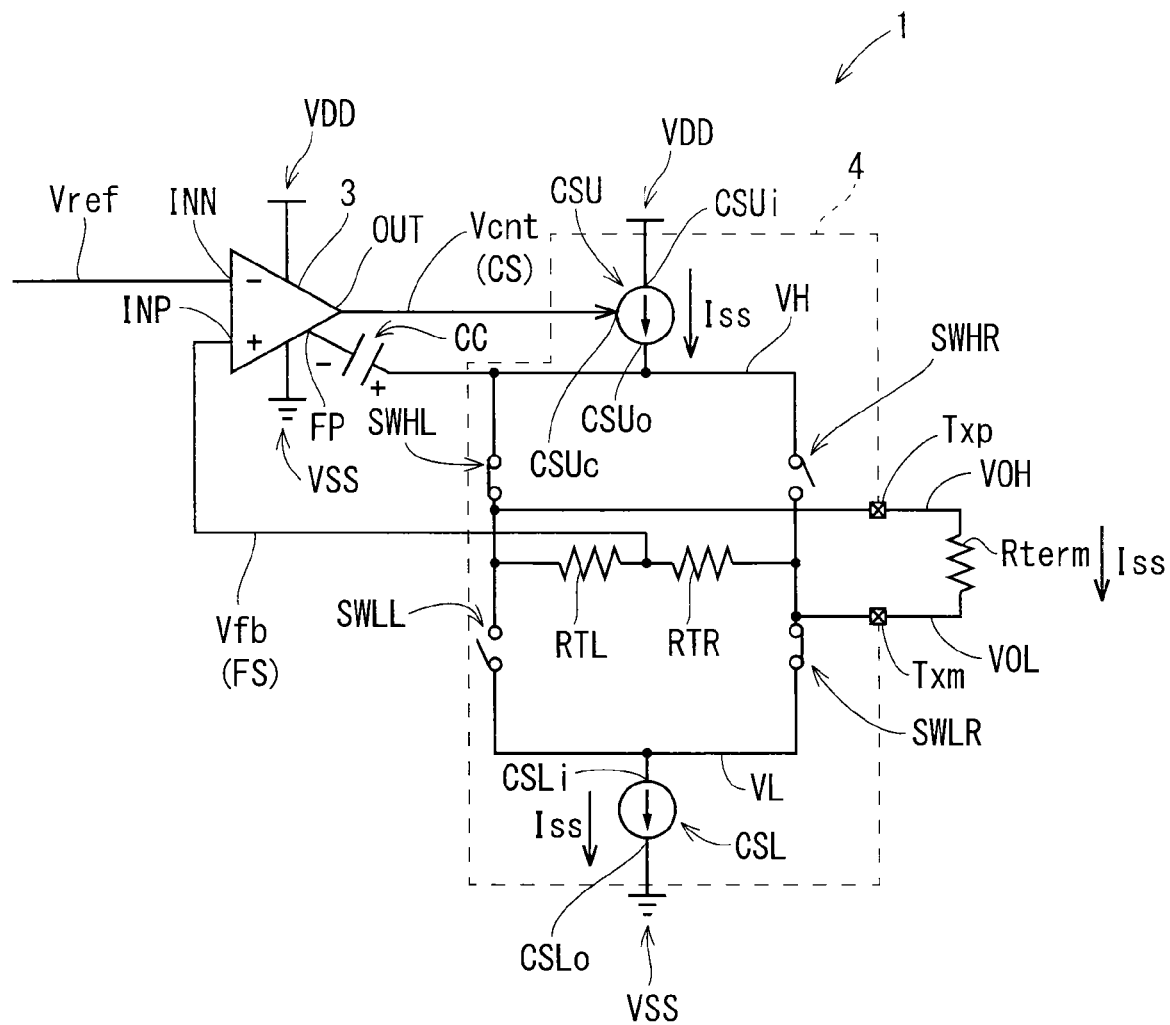
F I G. 1 2

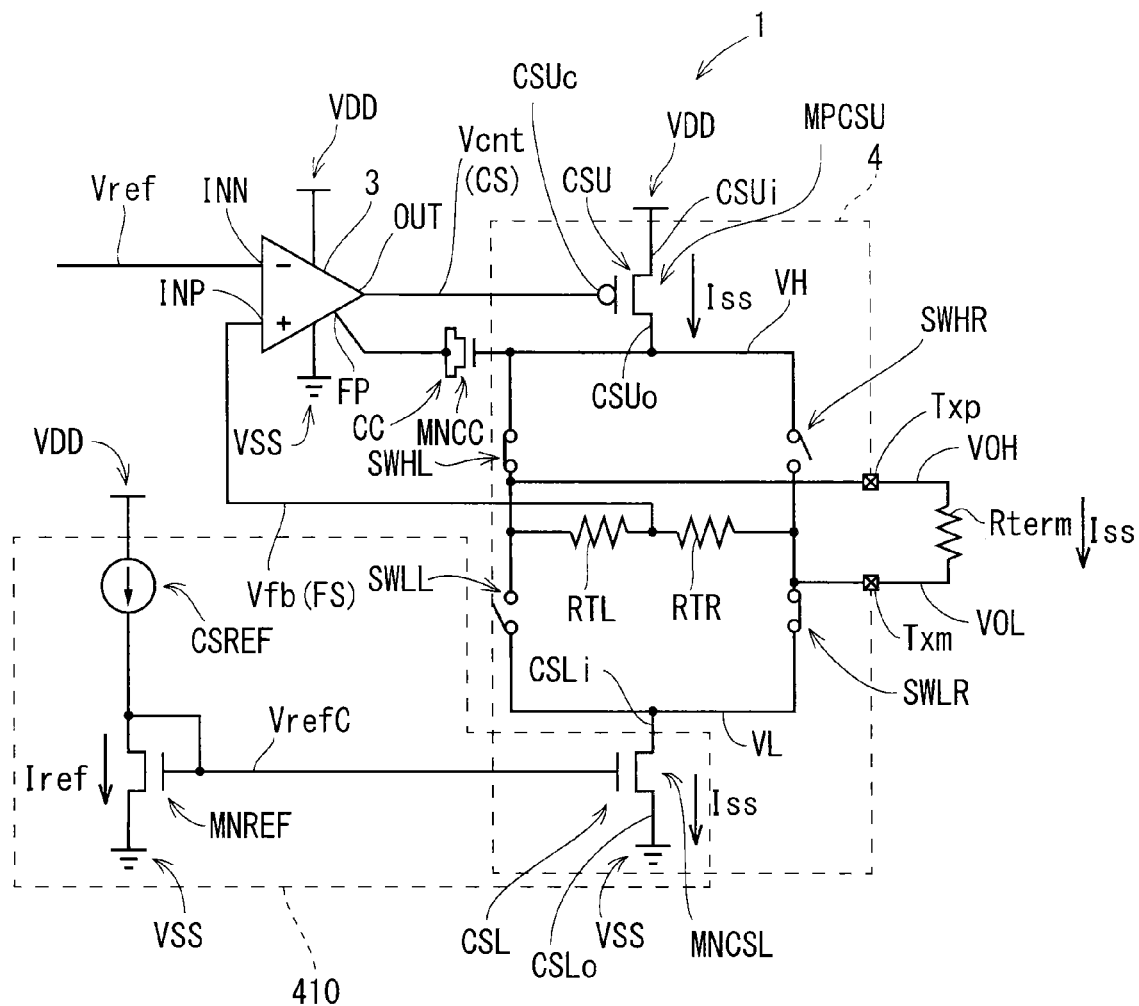
F I G. 1 3

SEMICONDUCTOR CIRCUIT AND AMPLIFIER CIRCUIT

BACKGROUND OF THE INVENTION

1. Field of the Invention

The present invention relates to an amplifier circuit.

2. Description of the Background Art

Various technologies have been proposed for amplifier circuits such as operational amplifiers, as disclosed in Japanese Patent Application Laid-Open Nos. 2008-228029, 2009-246780, and 2009-246985.

SUMMARY OF THE INVENTION

A semiconductor circuit includes a control target circuit and an amplifier circuit. The amplifier circuit outputs a control signal for controlling the control target circuit and receives input of a feedback signal from the control target circuit. The amplifier circuit and the control target circuit constitute a feedback loop that includes a plurality of poles. The semiconductor circuit further includes a semiconductor capacitive element for phase compensation in the feedback loop. The amplifier circuit has an output branch that includes a first transistor having a first current terminal from which the control signal is output and a second current terminal connected to a power supply potential, and a branch that is connected in parallel to the output branch and includes a cascode circuit. The cascode circuit includes a second transistor having third and fourth current terminals, and a third transistor having fifth and sixth current terminals. The fourth and fifth current terminals are connected to each other. The semiconductor capacitive element, which obtains the Miller effect, is connected between the control target circuit and the fourth and fifth current terminals.

BRIEF DESCRIPTION OF THE DRAWINGS

FIG. 7 illustrates a configuration of a fourth comparative circuit;

FIG. 11 illustrates a small-signal equivalent circuit of part of the fourth comparative circuit;

FIGS. 12 and 13 illustrate a configuration of part of a semiconductor circuit;

DESCRIPTION OF PREFERRED EMBODIMENTS

Overview of Semiconductor Circuit of Preferred Embodiment

Figure 1:
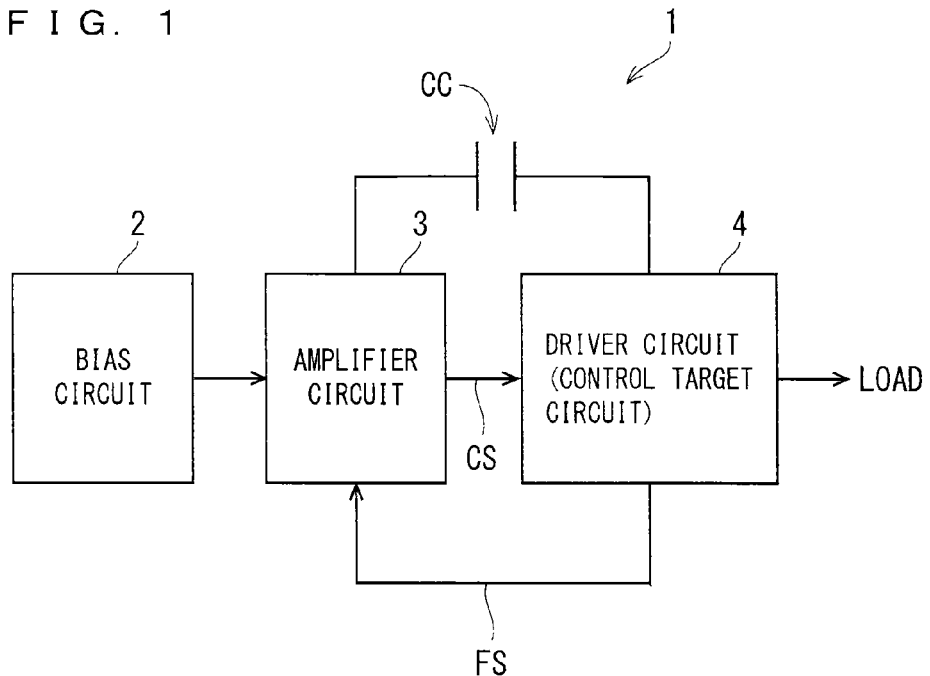
FIG. 1 illustrates a configuration of a semiconductor circuit.

FIG. 1 illustrates a configuration of a semiconductor circuit 1 according to a preferred embodiment. The semiconductor circuit 1 of this preferred embodiment is, for example, a semiconductor integrated circuit that is assembled in a single package. The semiconductor circuit 1 is, for example, an output buffer circuit that is used in low-voltage differential signaling (LVDS), mini-LVDS, or voltage-mode logic (VML), for example.

As illustrated in FIG. 1, the semiconductor circuit 1 includes a bias circuit 2, an amplifier circuit 3, and a driver circuit 4. The bias circuit 2 generates and outputs various bias potentials necessary in the amplifier circuit 3. The amplifier circuit 3 outputs a control signal CS for controlling the driver circuit 4. The driver circuit 4 is a control target circuit that is controlled by the amplifier circuit 3, and drives a load. A feedback signal FS is input from the driver circuit 4 to an input stage of the amplifier circuit 3. The amplifier circuit 3 controls an output of the driver circuit 4 by providing the control signal CS to the driver circuit 4.

In the semiconductor circuit 1 of the present preferred embodiment, the amplifier circuit 3 and the driver circuit 4 constitute a feedback loop that includes a plurality of poles. The semiconductor circuit 1 includes a capacitive element CC for phase compensation in the feedback loop. The capacitive element CC is a semiconductor capacitive element that is configured as a metal-oxide-semiconductor (MOS) transistor, for example. One end of the capacitive element CC is connected to the amplifier circuit 3 and the other end is connected to the driver circuit 4. Such a capacitive element for phase compensation is hereinafter referred to as a "phase compensation capacitive element."

A detailed description of the semiconductor circuit 1 of the present preferred embodiment will be given below, but before that, comparative circuits to be compared with the semiconductor circuit 1 will be described.

First Comparative Circuit

Figure 2:
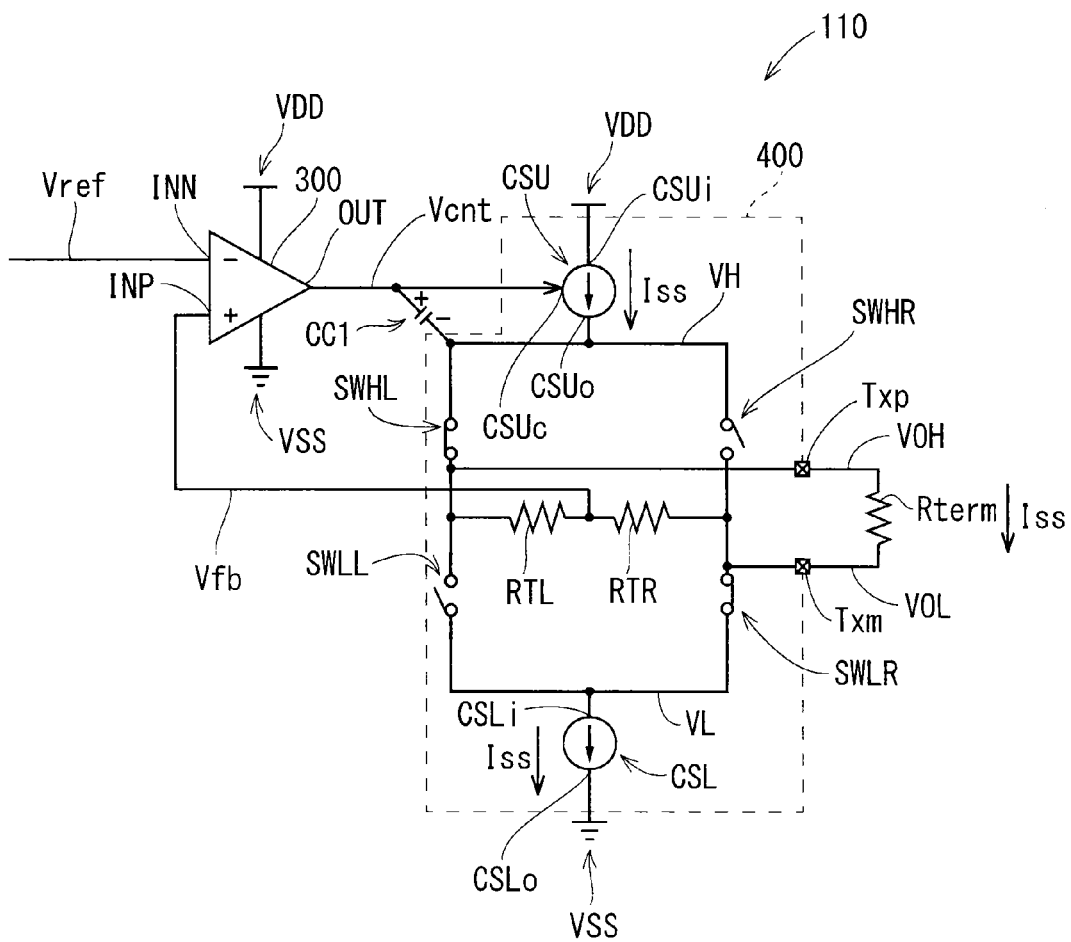
FIGS. 2 and 3 illustrate a configuration of a first comparative circuit.

FIG. 2 illustrates a configuration of a first comparative circuit 110. As illustrated in FIG. 2, the first comparative circuit 110 includes an operational amplifier 300 serving as an amplifier circuit, a driver circuit 400 that drives a load, and a phase compensation capacitive element CC1. In the first comparative circuit 110, as will be described later, the operational amplifier 300 and the driver circuit 400 constitute a feedback loop that includes a plurality of poles. The phase compensation capacitive element CC1 is a capacitive element for phase compensation in the feedback loop. The phase compensation capacitive element CC1 is a semiconductor capacitive element that is configured as a metal-oxide-semiconductor (MOS) transistor, for example.

The first comparative circuit 110 receives a first power supply potential VDD and a second power supply potential VSS that is smaller than the first power supply potential. The first comparative circuit 110 is powered by the first power supply potential VDD and the second power supply potential VSS. The first power supply potential VDD is a positive potential, for example, and the second power supply potential VSS is a ground potential (0V), for example. Hereinafter, the first power supply potential VDD is referred to as a "positive power supply potential VDD," and the second power supply potential VSS is referred to as a "ground potential VSS."

The operational amplifier 300 is powered by the positive power supply potential VDD and the ground potential VSS. The operational amplifier 300 receives input of a reference potential Vref at a negative input terminal INN and receives input of a feedback potential Vfb from the driver circuit 400 at a positive input terminal INP. A control potential Vcnt that is output from an output terminal OUT of the operational amplifier 300 is input to the driver circuit 400.

The driver circuit 400 is powered by the positive power supply potential VDD and the ground potential VSS. The driver circuit 400 includes a high potential-side current source CSU, a low potential-side current source CSL, high potential-side switching devices SWHL and SWHR, low potential-side switching devices SWLL and SWLR, and resistors RTL and RTR. The switching devices SWHL, SWHR, SWLL, and SWLR are, for example, MOS transistors.

An input terminal CSUi of the high potential-side current source CSU is connected to the positive power supply potential VDD, and an output terminal CSUo of the current source CSU is connected to one end of the switching device SWHL and one end of the switching device SWHR. A current Iss that flows from the current source CSU is controlled by the control potential Vcnt received from the operational amplifier 300. The current source CSU receives input of the control potential Vcnt at a control terminal CSUc. The current Iss increases as the control potential Vcnt decreases, whereas the current Iss decreases as the control potential Vcnt increases.

The other end of the switching device SWHL is connected to one end of the resistor RTL and one end of the switching device SWLL. The other end of the switching device SWHR is connected to one end of the resistor RTR and one end of the switching device SWLR. The other ends of the resistors RTL and RTR are connected to each other, and are also connected to the positive input terminal INP of the operational amplifier 300. Thus, a potential at the node between the resistors RTL and RTR is input as the feedback potential Vfb to the positive input terminal INP of the operational amplifier 300.

An input terminal CSLi of the low potential-side current source CSL is connected to the other end of the switching device SWLL and the other end of the switching device SWLR. An output terminal CSLo of the current source CSL is connected to the ground potential VSS. The current Iss flows to the current source CSL.

The driver circuit 400 outputs a differential output. One output terminal Txp of the driver circuit 400 is connected to the other end of the switching device SWHL, the one end of the resistor RTL, and the one end of the switching device SWLL, which are connected to one another. The other output terminal Txm of the driver circuit 400 is connected to the other end of the switching device SWHR, the one end of the switching device SWLR, and the one end of the resistor RTR, which are connected to one another. A terminating resistor Rterm is connected between the two output terminals Txp and Txm. The output terminals Txp and Txm constitute a differential output terminal.

The relationship among a resistance value rRterm of the terminating resistor Rterm, a resistance value rRTL of the resistor RTL, and a resistance value rRTR of the resistor RTR is given by the following expressions (1) to (3).

$$rRterm \ll rRTL \quad (1)$$

$$rRterm \ll rRTR \quad (2)$$

$$rRTL = rRTR \quad (3)$$

The resistance value rRterm is 100Ω, for example, and the resistance values rRTL and rRTR are from several kΩ to several tens of kΩ, for example.

In the driver circuit 400 having the above-described configuration, an external control circuit (not shown) controls the switching devices SWHL and SWLR as a pair and controls the switching devices SWHR and SWLL as a pair. Specifically, when the switching devices SWHL and SWLR are both "ON," the switching devices SWHR and SWLL are both "OFF, as illustrated in FIG. 2. When the switching devices SWHR and SWLL are both "ON," the switching devices SWHL and SWLR are both "OFF."

When the switching devices SWHL and SWLR are "ON" and the switching devices SWHR and SWLL are "OFF" as illustrated in FIG. 2, the current Iss from the current source CSU flows sequentially through the switching device SWHL, the output terminal Txp, the terminating resistor Rterm, the output terminal Txm, and the switching device SWLR to the current source CSL. This makes the potential at the output terminal Txp higher than the potential at the output terminal Txm and produces a differential signal (differential voltage) between the output terminals Txp and Txm. Thus, the differential signal is output from the output terminals Txp and Txm.

On the other hand, when the switching devices SWHR and SWLL are "ON" and the switching devices SWHL and SWLR are "OFF," the current Iss from the current source CSU flows sequentially through the switching device SWHR, the output terminal Txm, the terminating resistor Rterm, the output terminal Txp, and the switching device SWLL to the current source CSL. This makes the potential at the output terminal Txm higher than the potential at the output terminal Txp and produces a differential signal between the output terminals Txp and Txm.

Note that little current flows through the resistors RTL and RTR because the resistance values rRTL and rRTR of the resistors RTL and RTR are set sufficiently higher than the resistance value rRterm of the terminating resistor Rterm.

Hereinafter, the higher potential out of the potentials at the output terminals Txp and Txm is referred to as an "output potential VOH," and the lower potential is referred to as an "output potential VOL." In the example in FIG. 2 in which the potential at the output terminal Txp is higher than that at the output terminal Txm, the output potential VOH is output from the output terminal Txp, and the output potential VOL is output from the output terminal Txm.

The amplitude VOD of the differential signal output from the driver circuit 400 (hereinafter, referred to as an "output differential signal") is given by the following expression (4).

$$VOD = VOH - VOL \quad (4)$$

A central potential (common-mode potential) VOC of the output differential signal is given by the following expression (5).

$$VOC = (VOH + VOL)/2 \quad (5)$$

The amplitude VOD of the output differential signal can be given by the following expression (6), because the output differential signal is a voltage generated across the terminating resistor Rterm when the current Iss flows through the terminating resistor Rterm.

$$|VOD| = Iss \times rRterm \quad (6)$$

The potential at the node between the resistors RTL and RTR, that is, the feedback potential Vfb, matches the common-mode potential VOC, because the resistance value rRTL of the resistor RTL and the resistance value rRTR of the resistor RTR are the same value. Thus, the common-mode potential VOC is input to the positive input terminal INP of the operational amplifier 300.

The operational amplifier 300 compares the common-mode potential VOC (feedback potential Vfb) with the reference potential Vref. If the common-mode potential VOC is lower than the reference potential Vref, the operational amplifier 300 reduces the control potential Vcnt, and if the common-mode potential VOC is higher than the reference potential Vref, the operational amplifier 300 increases the control potential Vcnt. That is, if the common-mode potential VOC is lower than the reference potential Vref, the current Iss increases and the amplitude VOD and common-mode potential VOC of the output differential signal increase. Also, if the common-mode potential VOC is higher than the reference potential Vref, the current Iss decreases and the amplitude VOD and common-mode potential VOC of the output differential signal decrease.

In this way, the operational amplifier 300 controls the current source CSU of the driver circuit 400 such that the common-mode potential VOC matches the reference potential Vref. This reduces variation in the common-mode potential VOC of the output differential signal due to the load on the driver circuit 400 or the like.

One end of the phase compensation capacitive element CC1 is connected to the output terminal CSUo of the current source CSU, the one end of the switching device SWHL, and the one end of the switching device SWHR. The other end of the phase compensation capacitive element CC1 is connected to the output terminal OUT of the operational amplifier 300 and the control terminal CSUc of the current source CSU.

The phase compensation capacitive element CC1 is, for example, an NMOS transistor. The current source CSU is, for example, a PMOS transistor, and the current source CSL is, for example, an NMOS transistor.

Figure 3:
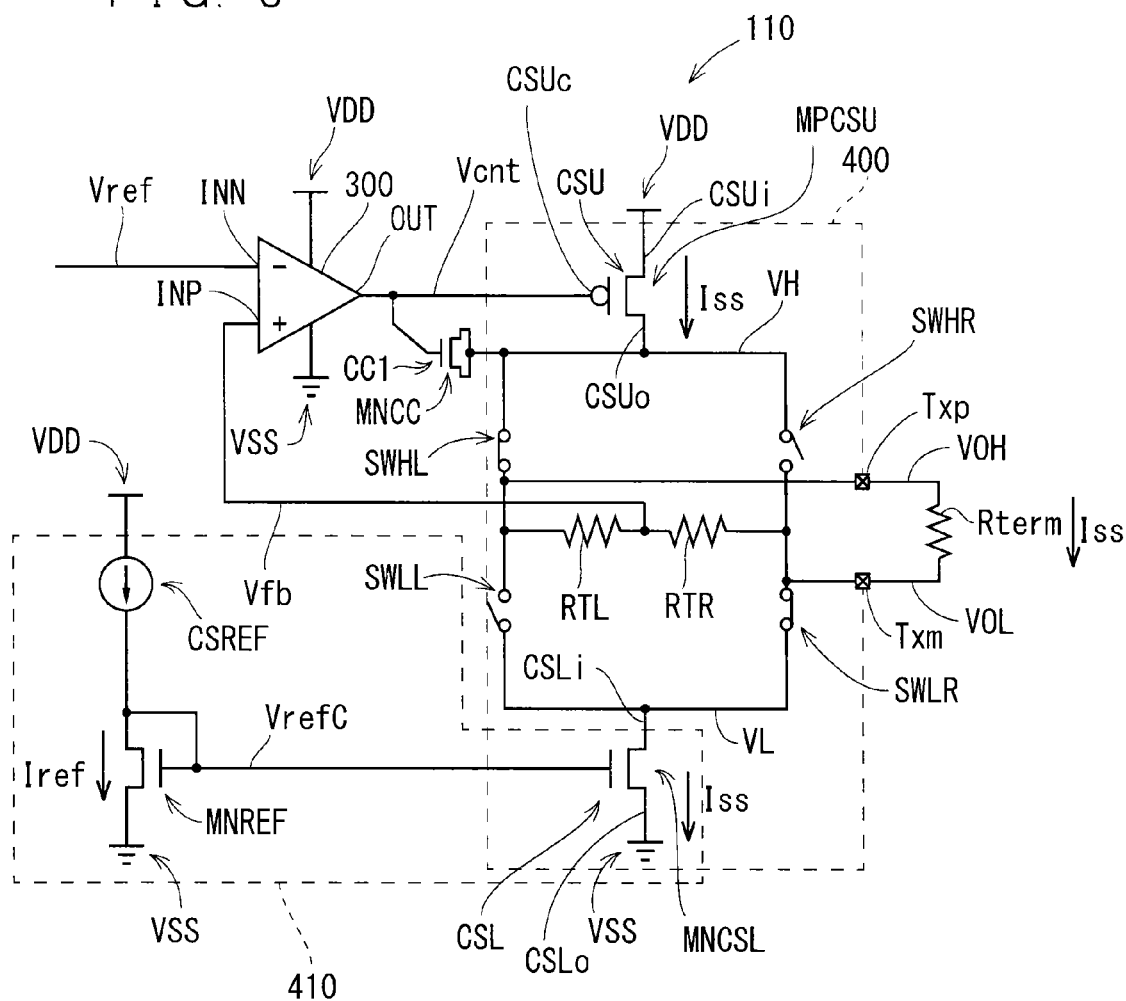

FIG. 3 is a block diagram illustrating a configuration of the first comparative circuit 110 when the current sources CSU and CSL are respectively a PMOS transistor and an NMOS transistor, and the phase compensation capacitive element CC1 is an NMOS transistor. Although the current source CSU in the example shown FIG. 3 is a single stage of PMOS transistor, it may be configured by multiple stages of cascode-connected PMOS transistors. Although the current source CSL in the example in FIG. 3 is a single stage of NMOS transistor, it may be configured by multiple stages of cascode-connected NMOS transistors.

In the driver circuit 400 illustrated in FIG. 3, the source, drain, and gate of a PMOS transistor MPCSU constituting the current source CSU respectively form the input terminal CSUi, the output terminal CSUo, and the control terminal CSUc of the current source CSU. The drain and source of an NMOS transistor MNCSL constituting the current source CSL respectively form the input terminal CSLi and the output terminal CSLo of the current source CSL. The sources and drains of the MOS transistors are also referred to as "current terminals," and the gates of the MOS transistors are also referred to as "control terminals."

The source and drain of an NMOS transistor MNCC constituting the phase compensation capacitive element CC1 are connected to each other and are also connected to the output terminal CSUo of the current source CSU (the drain of the PMOS transistor MPCSU), the one end of the switching device SWHL, and the one end of the switching device SWHR. The gate of the NMOS transistor MNCC is connected to the output terminal OUT of the operational amplifier 300 and the control terminal CSUc of the current source CSU (the gate of the PMOS transistor MPCSU).

When the current source CSL is the NMOS transistor MNCSL, a current mirror circuit 410 that includes the NMOS transistor MNCSL is provided. The current mirror circuit 410 further includes a reference current source CSREF and an NMOS transistor MNREF, aside from the NMOS transistor MNCSL. The input terminal of the reference current source CSREF is connected to the power supply potential VDD. The output terminal of the reference current source CSREF is connected to the drain and gate of the NMOS transistor MNREF and the gate of the NMOS transistor MNCSL. The source of the NMOS transistor MNREF is connected to the ground potential VSS.

In the current mirror circuit 410 having the above-described configuration, a flow of a reference current Iref from the reference current source CSRFEF between the drain and source of the NMOS transistor MNREF produces a potential based on the reference current Iref at the gate of the NMOS transistor MNREF. This potential is input as a reference potential VrefC to the gate of the NMOS transistor MNCSL, causing the current Iss to flow between the drain and source of the NMOS transistor MNCSL. A relationship between the reference current Iref and the current Iss is given by the following expression (7) using a mirror ratio N.

$$Iss = Iref \times N \qquad (7)$$

Since the amplitude VOD changes according to the current Iss as given by the above expression (6), it is possible to adjust the amplitude VOD by changing the reference current Iref flowing through the reference current source CSREF.

As understood from the above description, the operational amplifier 300 and the driver circuit 400 of the first comparative circuit 110 constitute a feedback loop. Since the operational amplifier 300 is an amplifier circuit, the frequency characteristics (frequency response characteristics) of the operational amplifier 300 include one or more poles. Moreover, the current source CSU, which is controlled by the control potential Vcnt received from the operational amplifier 300, can be regarded as a single stage of amplifier circuit in the feedback loop, and therefore, the frequency characteristics of the current source CSU include one pole. Accordingly, the operational amplifier 300 and the driver circuit 400 (more specifically, part of the driver circuit 400) constitute a feedback loop that includes two or more poles. In other words, the operational amplifier 300 and the driver circuit 400 constitute a feedback loop that includes multiple stages of amplifier circuits. The phase compensation capacitive element CC1 is a capacitive element for phase compensation in this feedback loop. The phase compensation capacitive element CC1 moves the pole(s) on the operational amplifier 300 side in the feedback loop to the low frequency side.

The phase compensation capacitive element CC1 is connected between the gate and drain of the PMOS transistor MPCSU constituting the current source CSU serving as an amplifier circuit, and thereby can be regarded as being connected between the input and output terminals of the amplifier circuit. Thus, the phase compensation capacitive element CC1 can obtain the Miller effect. It can, therefore, be considered that a capacitive element having a capacitance value (cCC1×A1) that is obtained by multiplying a capacitance value cCC1 of the phase compensation capacitive element CC1 by a gain A1 of the PMOS transistor MPCSU is connected between the output terminal OUT of the operational amplifier 300 and the positive power supply potential VDD. This allows the phase compensation capacitive element CC1 having a small capacitance value to be appropriately used in phase compensation.

Here, the phase compensation capacitive element CC1 may have an insulator sandwiched between interconnect layers, instead of being a semiconductor capacitive element such as a MOS transistor. The phase compensation capacitive element CC1 having an insulator sandwiched between interconnect layers provides lower area efficiency than the phase compensation capacitive element CC1 configured as a semiconductor capacitive element. Accordingly, in the former case, the layout area of the phase compensation capacitive element CC1 is several times larger than in the latter case.

On the other hand, when the phase compensation capacitive element CC1 is the MOS transistor MNCC as illustrated in FIG. 3, it is necessary to apply a higher voltage than the threshold voltage of the MOS transistor MNCC across the phase compensation capacitive element CC1, to obtain a stabilized capacitance value cCC1. When the phase compensation capacitive element CC1 is a varactor, the voltage dependency of the capacitance cCC1 is lower than in the case where the phase compensation capacitive element CC1 is a MOS transistor, but it is necessary to apply a voltage higher than the threshold value across the phase compensation capacitive element CC1, to obtain a sufficiently high capacitance value cCC1.

In this way, when the phase compensation capacitive element CC1 is a semiconductor capacitive element such as a MOS transistor, a voltage higher than the threshold value Vthcc needs to be applied across the phase compensation capacitive element CC1 to obtain a stabilized and sufficiently high capacitance value cCC1. In other words, the following expression (8), where Vpncc is the voltage across the phase compensation capacitive element CC1, needs to be satisfied to obtain an appropriate capacitance value cCC1.

$$Vpncc > Vthcc \tag{8}$$

When the phase compensation capacitive element CC1 is a MOS transistor, the threshold value Vthcc is a threshold voltage of the MOS transistor (a gate-source voltage that produces an inversion layer).

Figure 4:
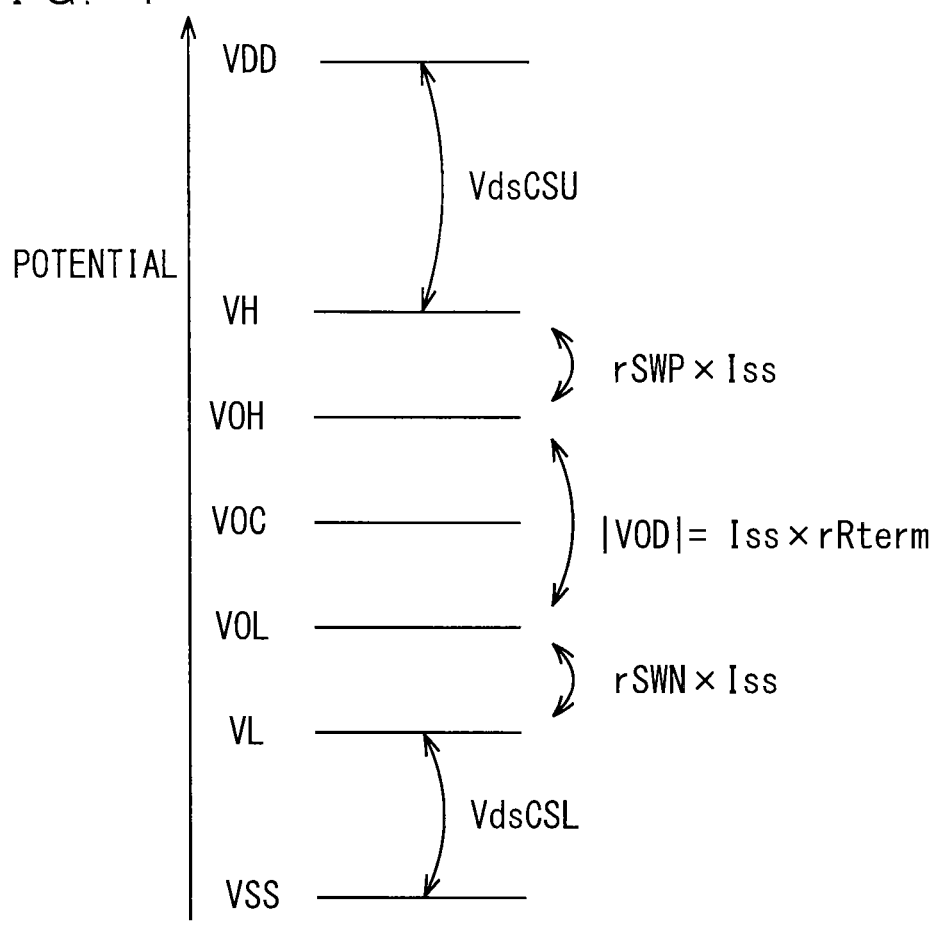
FIG. 4 illustrates a relationship among potentials within a driver circuit.

FIG. 4 illustrates a relationship among the various potentials within the driver circuit 400. The vertical axis in FIG. 4 shows the various potentials. In FIG. 4, VdsCSU is the drain-source voltage of the PMOS transistor MPCSU constituting the current source CSU; VH is the potential at the drain of the PMOS transistor MPCSU (the output terminal CSUo of the current source CSU); VdsCSL is the drain-source voltage of the NMOS transistor MNCSL constituting the current source CSL; VL is the potential at the drain of the NMOS transistor MNCSL (the input terminal CSLi of the current source CSL); rSWP is the resistance value (on-state resistance value) when the switching devices SWHL and SWHR are "ON"; and rSWN is the resistance value when the switching devices SWLL and SWLR are "ON."

When the feedback loop (feedback circuit) including the operational amplifier 300 function correctly in the first comparative circuit 110, the following expression (9) is satisfied since Vfb=Vref.

$$Vfb = (VOH + VOL)/2 = VOC = Vref \tag{9}$$

The following expression (10) is also satisfied.

$$VH = Iss \times (rSWP + rRterm // (rRTL + rRTR) + rSWN) + VL \tag{10}$$

The term "rRterm//(rRTL+rRTR)" in the expression (10) represents the resistance value of combined resistance of the terminating resistor Rterm and the resistors RTL and RTR between the output terminals Txp and Txm.

In addition, the following expressions (11) and (12) are also satisfied in the first comparative circuit 110.

$$rSWP \ll rRterm \tag{11}$$

$$rSWN \ll rRterm \tag{12}$$

Based on the expressions (11) and (12) and the above expressions (1) and (2), the following expressions (13) and (14) are satisfied.

$$VH = VOH = VOC + rRterm/2 \times Iss \tag{13}$$

$$VL = VOL = VOC - rRterm/2 \times Iss \tag{14}$$

Here, the following expressions (15) and (16) are satisfied for a MOS transistor that operates in the saturation region.

$$Ids = K \times W/L \times (Vgs - Vth)^2 = K \times W/L \times Vov^2 \tag{15}$$

$$Vov = Vgs - Vth \tag{16}$$

where Ids is the drain-source current of the MOS transistor; Vgs is the gate-source voltage of the MOS transistor; Vth is the threshold voltage of the MOS transistor; and K is the constant that depends on the process of the MOS transistor. The constant K, the threshold voltage Vth, the voltage Vgs, and a voltage Vds, which will be described later, take positive values when the MOS transistor is an NMOS transistor, and take negative values when the MOS transistor is a PMOS transistors.

In order to satisfy the expression (15), that is, in order for the MOS transistor to operate in the saturation region, both of the following expressions (17) and (18) need to be satisfied.

$$|Vgs| > |Vth| \tag{17}$$

$$|Vgs - Vth| > |Vds| \tag{18}$$

Note that the expressions (17) and (18) apply to either case where the MOS transistor is a PMOS transistor or an NMOS transistor. Here, Vds is the drain-source voltage of the MOS transistor.

In order for the PMOS transistor MPCSU constituting the current source CSU to function as a current source, the PMOS transistor MPCSU needs to operate in the saturation region. In order for the PMOS transistor MPCSU to operate in the saturation region, the following expression (19) needs to be satisfied using the expression (18).

$$(VgsCSU - VthCSU) > VdsCSU \tag{19}$$

In the expression (19), VgsCSU is the gate-source voltage of the PMOS transistor MPCSU, and VthCSU is the threshold voltage of the PMOS transistor MPCSU. The voltages VgsCSU and VdsCSU and the threshold voltage VthCSU take negative values, respectively.

The voltages VdsCSU and VgsCSU are respectively given by the following expressions (20) and (21).

$$VdsCSU = VH - VDD \tag{20}$$

$$VgsCSU = Vcnt - VDD \tag{21}$$

From the expressions (20) and (21) and the above expression (19), the following expression (22) can be obtained as one conditional expression for the PMOS transistor MPCSU to operate in the saturation region.

$$Vcnt > VthCSU + VH \tag{22}$$

From the expression (21) and the above expression (17), the following expression (23) can also be obtained as another conditional expression in order for the PMOS transistor MPCSU to operate in the saturation region.

$$Vcnt < VthCSU + VDD \quad (23)$$

In order for the PMOS transistor MPCSU to operate in the saturation region, both of the expressions (22) and (23) need to be satisfied.

For the PMOS transistor MPCSU, the following expression (24) can also be obtained from the expressions (15) and (21).

$$VgsCSU = Vcnt - VDD = -(-Iss/K \times L/W)^{1/2} + VthCSU \quad (24)$$

Since the expression (24) is satisfied for the PMOS transistor MPCSU that operates in the saturation region, it is found from the expression (24) that in the first comparative circuit 110, the current Iss increases as the control potential Vcnt decreases, and the current Iss decreases as the control potential Vcnt increases.

Here, the above expression (13) shows that the potential VH increases if the reference current Iref flowing through the reference current source CSREF of the current mirror circuit 410 is increased to increase the current Iss and to thereby increase the amplitude VOD of the output differential signal output from the driver circuit 400. The expression (24) also shows that the control potential Vcnt decreases if the current Iss increases. Accordingly, it becomes difficult to satisfy the expression (22) if the amplitude VOD of the output differential signal is increased.

Thus, in order for the PMOS transistor MPCSU to operate in the saturation region, the amplitude VOD of the output differential signal cannot be overly increased. In other words, the magnitude of the amplitude VOD is limited due to the operating point of the current source CSU, which is determined based on the relationship between the potential VH and the control potential Vcnt, which are affected by the current Iss.

On the other hand, in order for the phase compensation capacitive element CC1 to operate properly, the above expression (8), i.e., Vpncc>Vthcc, needs to be satisfied. A voltage Vpncc across the phase compensation capacitive element CC1 is given by the following expression (25) using the expressions (13) and (21).

$$Vpncc = Vcnt - VH = VDD + VgsCSU - (Iss \times rRterm/2 + VOC) \quad (25)$$

Using the expression (25), the expression (8) can be modified into the following expression (26).

$$Vcnt - VH > Vthcc \quad (26)$$

The expression (25) shows that it is difficult to satisfy Vpncc>Vthcc when the positive power supply potential VDD is low (i.e., the circuit operates at a low voltage), when the common-mode potential VOC is high, when the current Iss is high (i.e., the amplitude VOD is high), or when the resistance value rRterm of the terminating resistor is high. Since the potential VH is high when the on-state resistance value rSWP of the switching devices SWHL and SWHR are high, it is also difficult to satisfy Vpncc>Vthcc when the on-state resistance value rSWP of the switching devices SWHL and SWHR is high.

According to the expression (13), the potential VH increases if the current Iss is increased to increase the amplitude VOD of the output differential signal to be output from the driver circuit 400. The expression (24) shows that the control potential Vcnt decreases as the current Iss increases. Thus, it is difficult to satisfy the expression (26) if the amplitude VOD of the output differential signal is increased. That is, in order for the phase compensation capacitive element CC1 to operate appropriately, the amplitude VOD of the output differential signal cannot be overly increased. In other words, the amplitude VOD is limited due to the operating point of the phase compensation capacitive element CC1, which is determined based on the relationship between the potential VH and the control potential Vcnt, which are affected by the current Iss.

As described above, in the first comparative circuit 110, the magnitude of the amplitude VOD is limited due to the operating point of the current source CSU as given by the expression (22) and due to the operating point of the phase compensation capacitive element CC1 as given by the expression (26). Accordingly, it is necessary to consider the operating points of both of the current source CSU and the phase compensation capacitive element CC1 in determining the amplitude VOD.

If it is easier to satisfy the expression (22) than to satisfy the expression (26) in the case of increasing the amplitude VOD of the output differential signal, the amplitude VOD is limited due to the operating point of the phase compensation capacitive element CC1. In other words, if it is easier to satisfy the expression (22) than to satisfy the expression (26) in the case of increasing the current Iss, the current Iss is limited due to the operating point of the phase compensation capacitive element CC1. In this case, it becomes more difficult to increase the amplitude VOD (current Iss) than in the case where the phase compensation capacitive element CC1 is absent.

Second Comparative Circuit

Figure 5:
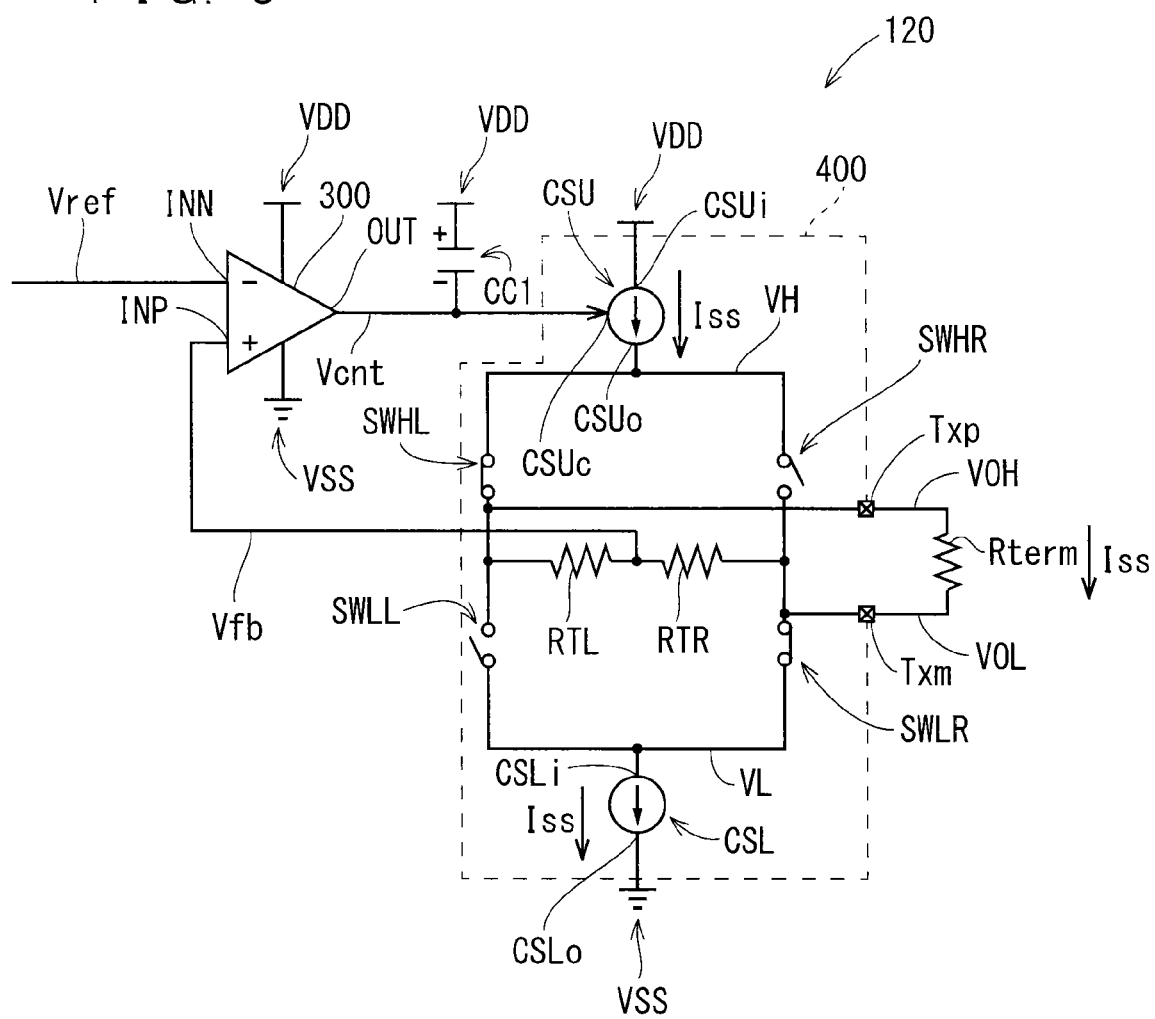
FIG. 5 illustrates a configuration of a second comparative circuit.

A second comparative circuit 120 illustrated in FIG. 5 can be conceived in order to reduce the likelihood of the current Iss being limited due to the operating point of the phase compensation capacitive element CC1. In the second comparative circuit 120, the phase compensation capacitive element CC1 is connected between the positive power supply potential VDD and the output terminal OUT of the operational amplifier 300 as illustrated in FIG. 5. In other words, the phase compensation capacitive element CC1 is connected between the source and gate of the PMOS transistor MPCSU constituting the current source CSU.

The voltage Vpncc in the second comparative circuit 120 is given by the following expression (27).

$$Vpncc = VDD - Vcnt \quad (27)$$

The expression (27) indicates that, unlike the voltage Vpncc in the first comparative circuit 110, the voltage Vpncc in the second comparative circuit 120 is unaffected by the potential VH that changes according to the current Iss. Thus, even if the current Iss is increased, the voltage Vpncc is less likely to be affected by that increase. Therefore, the current Iss is less likely to be limited due to the operating point of the phase compensation capacitive element CC1.

In the second comparative circuit 120, however, the phase compensation capacitive element CC1 cannot obtain the Miller effect and therefore has a small capacitance value per unit area. In other words, there is a problem with the second comparative circuit 120 in that the phase compensation capacitive element CC1 has low area efficiency.

Third Comparative Circuit

Figure 6:
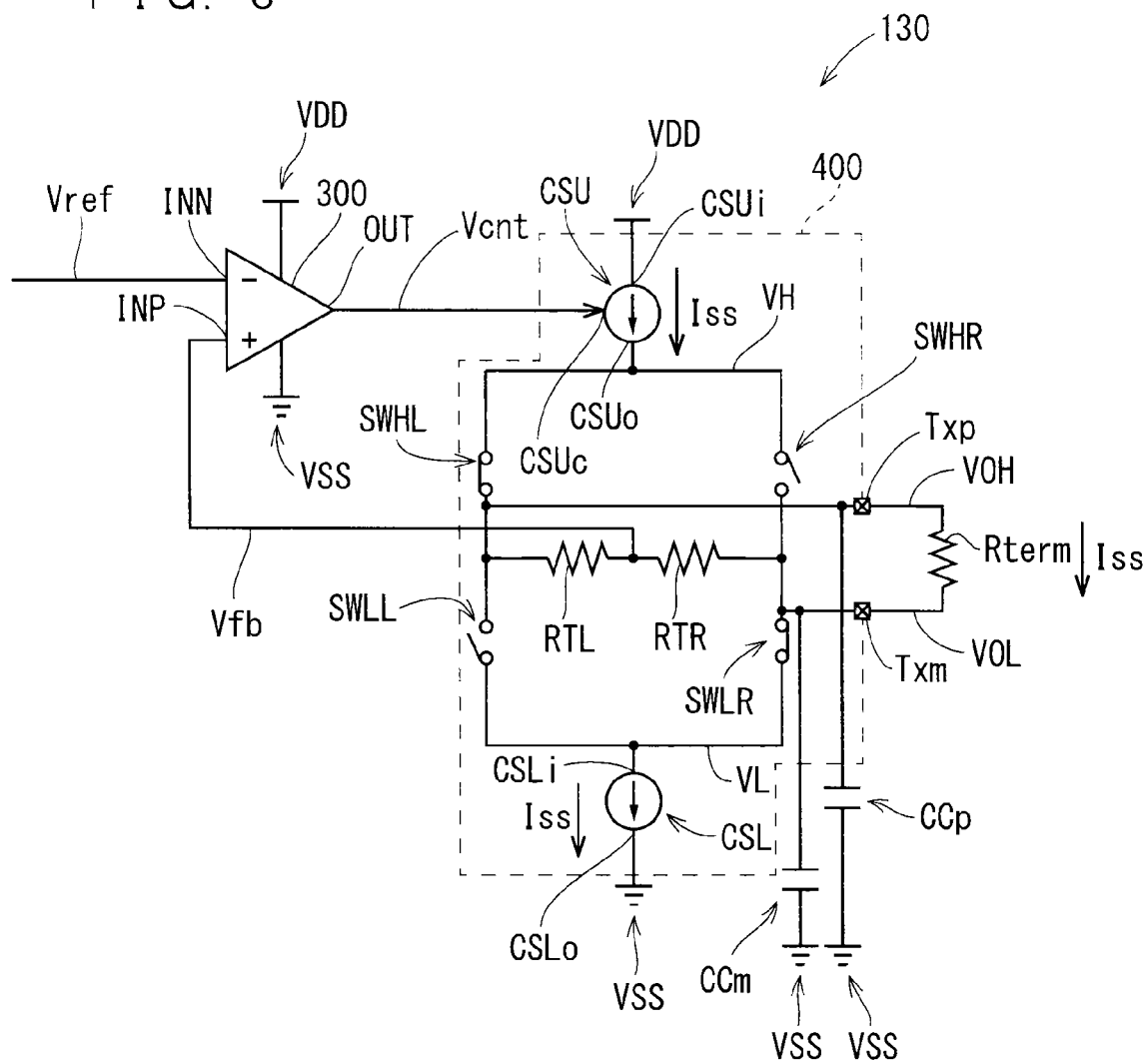
FIG. 6 illustrates a configuration of a third comparative circuit.

FIG. 6 illustrates a configuration of a third comparative circuit 130. As illustrated in FIG. 6, the third comparative circuit 130 includes phase compensation capacitive elements CCp and CCm, instead of the phase compensation capacitive element CC1. The phase compensation capacitive element CCp is connected between the output terminal Txp of the driver circuit 400 and the ground potential VSS. The phase compensation capacitive element CCm is connected between the output terminal Txm of the driver circuit 400 and the ground potential VSS.

In this third comparative circuit 130, phase compensation is performed by a pole on the driver circuit 400 side in the feedback loop shifting toward the low-frequency side.

The phase compensation capacitive elements CCp and CCm, however, cannot obtain the Miller effect and thus have small capacitance values per unit area.

Additionally, the phase compensation capacitive elements CCp and CCm that are connected respectively to the output terminals Txp and Txm impair slew rate characteristics of the output differential signal.

Moreover, the capacitance values of the phase compensation capacitive elements CCp and CCm need to be increased in order to reduce the likelihood of the output differential signal being affected by capacitances connected to the output terminals Txp and Txm, such as a parasitic capacitance, that exist outside the driver circuit 400. This increases the area required to lay out the phase compensation capacitive elements CCp and CCm.

Fourth Comparative Circuit

Figure 8:
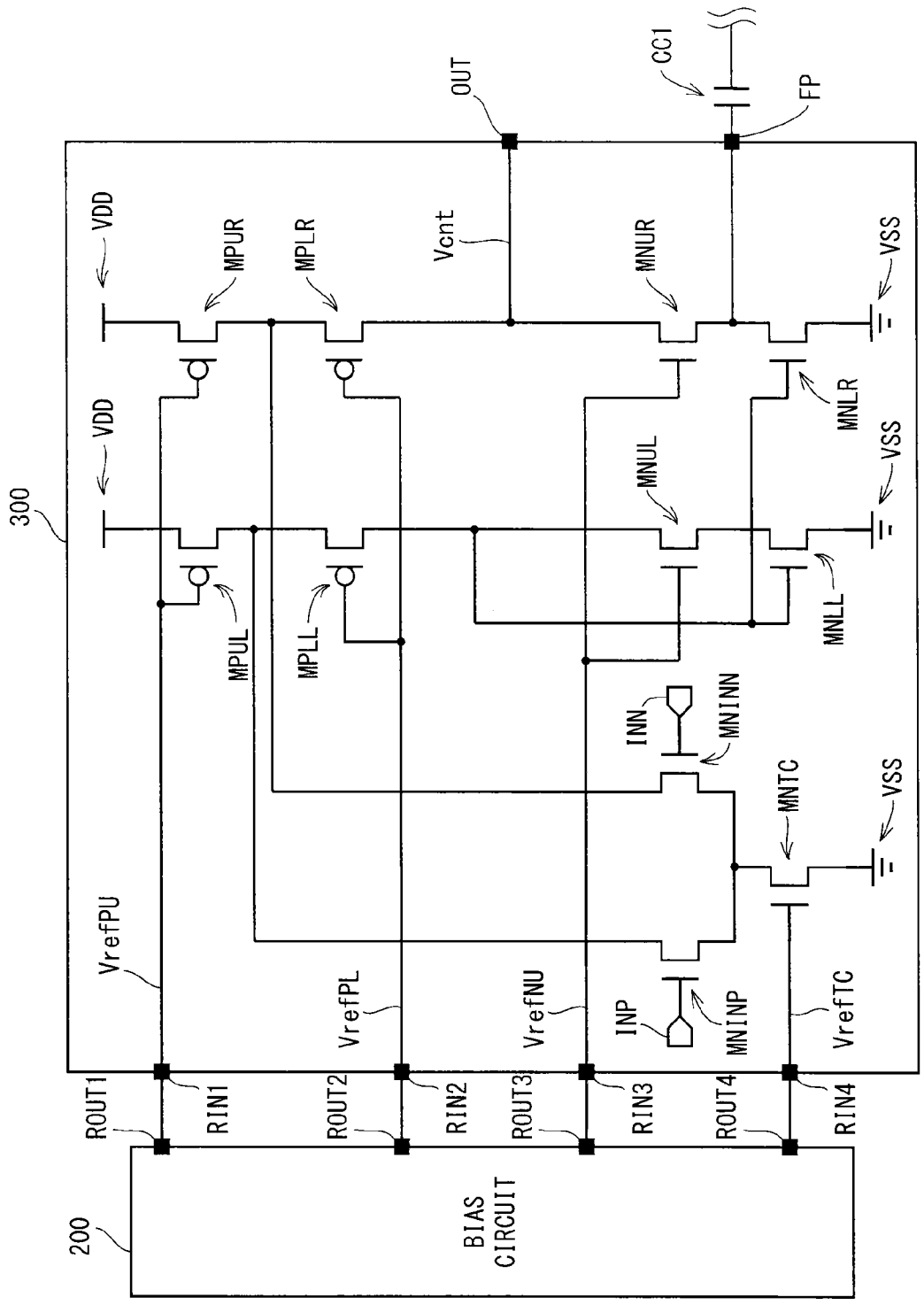
FIG. 8 illustrates a configuration of an operational amplifier of the fourth comparative circuit.

FIG. 7 illustrates a configuration of a fourth comparative circuit 140. In the fourth comparative circuit 140, one end of a phase compensation capacitive element CC1 is connected not to the output terminal OUT of the operational amplifier 300 but to a cascode circuit of the operational amplifier 300. FIG. 8 illustrates a configuration of the operational amplifier 300. FIG. 8 also illustrates the bias circuit 200 that outputs bias potentials to the operational amplifier 300. Note that the bias circuit 200 may be provided in the operational amplifier 300.

As illustrated in FIG. 8, the operational amplifier 300 includes seven NMOS transistors MNINP, MNINN, MNTC, MNUL, MNUR, MNLL, and MNLR and four PMOS transistors MPUL, MPUR, MPLL, and MPLR. The operational amplifier 300 in FIG. 8 is referred to as a "folded cascode operational amplifier."

The gates of the NMOS transistors MNINP and MNINN are respectively connected to the positive input terminal INP and the negative input terminal INN. The sources of the NMOS transistors MNINP and MNINN are connected to the drain of the NMOS transistor MNTC. The source of the NMOS transistor MNTC is connected to the ground potential VSS.

The PMOS transistors MPUL and MPLL are cascode-connected, and the PMOS transistors MPUR and MPLR are cascode-connected. The sources of the PMOS transistors MPUL and MPUR are connected to the positive power supply potential VDD. The gates of the PMOS transistors MPUL and MPUR are connected to each other. The drains of the PMOS transistors MPUL and MPUR are respectively connected to the sources of the PMOS transistors MPLL and MPLR. The gates of the PMOS transistors MPLL and MPLR are connected to each other. The drain of the PMOS transistor MPUL and the source of the PMOS transistor MPLL are connected to the drain of the NMOS transistor MNINP in the input stage. The drain of the PMOS transistor MPUR and the source of the PMOS transistor MPLR are connected to the drain of the NMOS transistor MNINN in the input stage.

The NMOS transistors MNUL and MNLL are cascode-connected, and the NMOS transistors MNUR and MNLR are cascode-connected. The drains of the NMOS transistors MNUL and MNUR are respectively connected to the drains of the PMOS transistors MPLL and MPLR. The sources of the NMOS transistors MNUL and MNUR are respectively connected to the drains of the NMOS transistors MNLL and MNLR. The sources of the NMOS transistors MNLL and MNLR are connected to the ground potential VSS. The gates of the NMOS transistors MNUL and MNUR are connected to each other. The gates of the NMOS transistors MNLL and MNLR are connected to each other. The gates of the NMOS transistors MNLL and MNLR are connected to the drains of the NMOS transistor MNUL and the PMOS transistor MPLL.

The operational amplifier 300 includes a plurality of bias input terminals RIN1 to RIN4 that respectively receive input of bias potentials VrefPU, VrefPL, VrefNU, and VrefTC that are output from the bias circuit 200. The bias potential VrefPU that is input to the bias input terminal RIN1 is input to the gates of the PMOS transistors MPUL and MPUR. The bias potential VrefPL that is input to the bias input terminal RIN2 is input to the gates of the PMOS transistors MPLL and MPLR. The bias potential VrefNU that is input to the bias input terminal RIN3 is input to the gates of the NMOS transistors MNUL and MNUR. The bias potential VrefTC that is input to the bias input terminal RIN4 is input to the gate of the NMOS transistor MNTC.

The drains of the PMOS transistor MPLR and the NMOS transistor MNUR are connected to the output terminal OUT. A potential at the drains of the PMOS transistor MPLR and the NMOS transistor MNUR is output as the control potential Vcnt from the output terminal OUT to the driver circuit 400.

The operational amplifier 300 includes a feedback terminal FP that is connected to the source of the NMOS transistor MNUR and the drain of the NMOS transistor MNLR. The feedback terminal FP is connected to the one end of the phase compensation capacitive element CC1. This allows the one end of the phase compensation capacitive element CC1 to be connected to a cascode circuit constituted by the NMOS transistors MNUR and MNLR. In other words, the one end of the phase compensation capacitive element CC1 is connected to both of the source of the NMOS transistor MNUR and the drain of the NMOS transistor MNLR. The other end of the phase compensation capacitive element CC1 is connected to the output terminal CSUo of the current source CSU.

In the fourth comparative circuit 140, the potential VH is higher than the potential at the feedback terminal FP. Thus, when the phase compensation capacitive element CC1 is the NMOS transistor MNCC as illustrated in FIG. 3, the gate of the NMOS transistor MNCC is connected to the output terminal CSUo of the current source CSU, and the source and drain of the NMOS transistor MNCC are connected to the feedback terminal FP.

Figure 9:
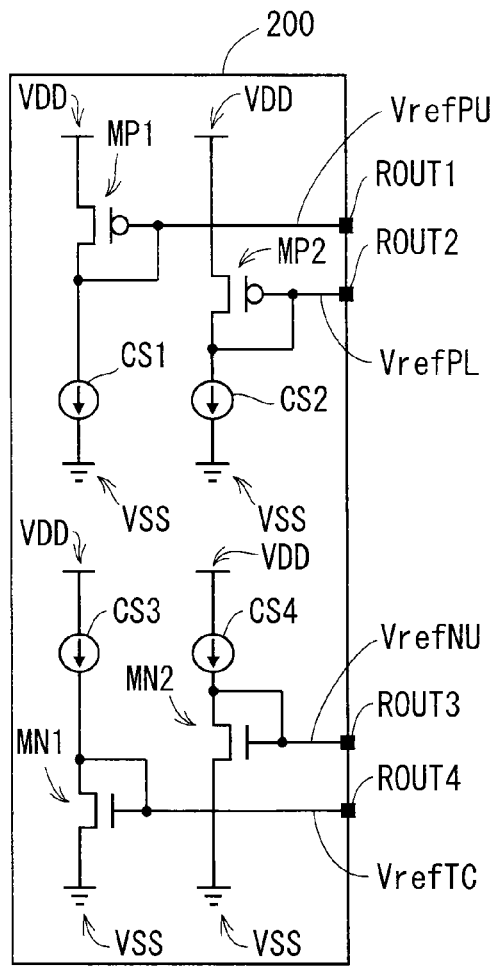
FIG. 9 illustrates a configuration of a bias circuit of the fourth comparative circuit.

FIG. 9 illustrates a configuration of the bias circuit 200. As illustrated in FIG. 9, the bias circuit 200 includes PMOS transistors MP1 and MP2, NMOS transistors MN1 and MN2, and current sources CS1 to CS4. The sources of the PMOS transistors MP1 and MP2 are connected to the positive power supply potential VDD. The drains of the PMOS transistors MP1 and MP2 are respectively connected to input terminals of the current sources CS1 and CS2. The gate and drain of the PMOS transistor MP1 are connected to each other, and the gate and drain of the PMOS transistor MP2 are connected to each other. The output terminals of the current sources CS1 and CS2 are connected to the ground potential VSS.

The sources of the NMOS transistors MN1 and MN2 are connected to the ground potential VSS. The drains of the NMOS transistors MN1 and MN2 are respectively connected to output terminals of the current sources CS3 and CS4. The gate and drain of the NMOS transistor MN1 are connected to each other, and the gate and drain of the NMOS transistor MN2 are connected to each other. Input terminals of the current sources CS3 and CS4 are connected to the positive power supply potential VDD.

The bias circuit 200 includes bias output terminals ROUT1 to ROUT4 that are respectively connected to the bias input terminals RIN1 to RIN4 of the operational amplifier 300. The bias output terminal ROUT1 is connected to the gate and drain of the PMOS transistor MP1. The PMOS transistor MP1 and current source CS1 of the bias circuit 200 and the PMOS transistors MPUL and MPUR of the operational amplifier 300 constitute a current mirror circuit. A potential at the gate and drain of the PMOS transistor MP1 is output as the bias potential VrefPU from the bias output terminal ROUT1.

The bias output terminal ROUT2 is connected to the gate and drain of the PMOS transistor MP2. The PMOS transistor MP2 and current source CS2 of the bias circuit 200 and the PMOS transistors MPLL and MPLR of the operational amplifier 300 constitute a current mirror circuit. A potential at the gate and drain of the PMOS transistor MP2 is output as the bias potential VrefPL from the bias output terminal ROUT2.

The bias output terminal ROUT3 is connected to the gate and drain of the NMOS transistor MN2. The NMOS transistor MN2 and current source CS4 of the bias circuit 200 and the NMOS transistors MNUL and MNUR of the operational amplifier 300 constitute a current mirror circuit. A potential at the gate and drain of the NMOS transistor MN2 is output as the bias potential VrefNU from the bias output terminal ROUT3.

The bias output terminal ROUT4 is connected to the gate and drain of the NMOS transistor MN1. The NMOS transistor MN1 and current source CS3 of the bias circuit 200 and the NMOS transistor MNTC of the operational amplifier 300 constitute a current mirror circuit. A potential at the gate and drain of the NMOS transistor MN1 is output as the bias potential VrefTC from the bias output terminal ROUT4.

In the fourth comparative circuit 140 having the above-described configuration, the voltage Vpncc across the phase compensation capacitive element CC1 is given by the following expression (28):

$$Vpncc = VH - VdsN1 \quad (28)$$

where VdsN1 is the drain-source voltage of the NMOS transistor MNLR that is present within a last-stage branch of the operational amplifier 300.

Thus, the above expression (8) can be modified into the following expression (29):

$$VH - VdsN1 > Vthcc \quad (29)$$

As can be seen from the expression (29), unlike in the above-described first comparative circuit 110 (see the expression (26)), the operating point of the phase compensation capacitive element CC1 in the fourth comparative circuit 140 is unaffected by the control potential Vcnt that changes according to the current Iss. The drain-source voltage VdsN1 of the NMOS transistor MNLR is also unaffected by the current Iss. It is thus easier, when the current Iss is increased, to satisfy the expression (29) than to satisfy the expression (26). This reduces the likelihood of the current Iss being limited due to the operating point of the phase compensation capacitive element CC1.

In addition, the potential VH can be readily increased with a general design method to be higher than the value obtained by adding the threshold value Vthcc and the voltage VdsN1. This makes it easy to satisfy the expression (29).

Moreover, the phase compensation capacitive element CC1 in the fourth comparative circuit 140 can obtain the Miller effect. This increases an effective capacitance value of the phase compensation capacitive element CC1 and improves the area efficiency of the phase compensation capacitive element CC1. This will now be described below.

First, the concept of the Miller effect will be described, using a common-source amplifier circuit 150 illustrated in FIG. 10. In the common-source amplifier circuit 150 in FIG. 10, the source of an NMOS transistor MN10 is connected to the ground potential VSS. A capacitive element CC10 is connected between the gate and drain of the NMOS transistor NM10. The drain of the NMOS transistor MN10 is connected via an output resistor R10 to the positive power supply potential VDD.

Here, assuming that an amplifier circuit including a capacitive element is a small-signal equivalent circuit, the capacitive element can obtain the Miller effect when a potential change at one end of the capacitive element causes a potential change in the reverse direction by a factor of the gain at the other end of the capacitive element.

A relationship between an input potential v1 and an output potential v2 of the common-source amplifier circuit 150 is given by the following expression (30).

$$v2 = -1 \times v1 \times gm \times r10 = -v1 \times A10 \quad (30)$$

where gm is the transconductance of the NMOS transistor MN10, r10 is the resistance value of the output resistor R10, and A10 is the magnitude of the gain of the common-source amplifier circuit 150.

A voltage vpn across the capacitive element CC10 is given by the following expression (31).

$$vpn = v2 - v1 = -(A10+1) \times v1 \quad (31)$$

If $A10 \gg 1$, the voltage vpn across the capacitive element CC10 can be obtained by multiplying the input potential v1 by the gain A10, according to the expression (31). Consequently, the input terminal of the common-source amplifier circuit 150 (the gate of the NMOS transistor MN10) appears to be connected to a capacitive element having a capacitance value that is obtained by multiplying the capacitance value of the capacitive element CC10 by the gain A10. In other words, the capacitive element CC10 obtains the Miller effect.

Next, the Miller effect received by the phase compensation capacitive element CC1 in the fourth comparative circuit 140 will be described. FIG. 11 illustrates a small-signal equivalent circuit of part of the fourth comparative circuit 140.

As illustrated in FIG. 11, in this small-signal equivalent circuit, the NMOS transistor MNLR of the operational amplifier 300 can be regarded as a current source CS20, and the PMOS transistors MPUR and MPLR of the operational amplifier 300 can be regarded as an equivalent resistor R20. The gate of the NMOS transistor MNUR of the operational amplifier 300 can be regarded as being grounded in the small-signal equivalent circuit. Also, a circuit portion of the driver circuit 400 that ranges from the output terminal CSUo of the current source CSU to the output terminal CSLo of the current source CSL can be regarded as an equivalent resistor R21 in the small-signal equivalent circuit.

Since the gate of the NMOS transistor MNUR can be regarded as being grounded, the entire small-signal current icc flowing through the phase compensation capacitive element CC1 flows through the NMOS transistor MNUR.

As a result, an equivalent resistance value r20 of the equivalent resistor R20 produces a small-signal potential vent, which is given by the following expression (32), at the drain of the NMOS transistor MNUR.

$$vcnt = icc \times r20 \quad (32)$$

The PMOS transistor MPCSU constituting the current source CSU passes a small-signal current i20 that is obtained by multiplying the small-signal potential vent by the transconductance gmCSU of the PMOS transistor MPCSU. The small-signal current i20 is given by the following expression (33).

$$i20 = -vcnt \times gmCSU \quad (33)$$

If the equivalent resistor R21 has a resistance value r21, a small-signal potential vh that is given by the following expression (34) is generated at the output terminal CSUo of the current source CSU.

$$vh = i20 \times r21 = -vcnt \times gmCSU \times r21 = -icc \times r20 \times A20 \quad (34)$$

In the expression (34), A20 is the magnitude of the gain of the driver circuit 400, which is given by the following expression (35).

$$A20 = gmCSU \times r21 \quad (35)$$

Here, the small-signal potential v20 at the source of the NMOS transistor MNUR that is grounded at the gate can be expressed by the product of the small-signal current icc and the reciprocal of the transconductance gmMNUR of the NMOS transistor MNUR, as given by the following expression (36).

$$v20 = 1/gmMNUR \times icc \quad (36)$$

The small-signal potential vh is thus given by the following expression (37).

$$vh = -v20 \times gmMNUR \times r20 \times A20 \quad (37)$$

Thus, the voltage Vpn20 across the phase compensation capacitive element CC1 is given by the following expression (38).

$$vpn20 = vh - v20 = -(1 + A20 \times r20 \times gmMNUR) \times v20 \quad (38)$$

Figure 10:
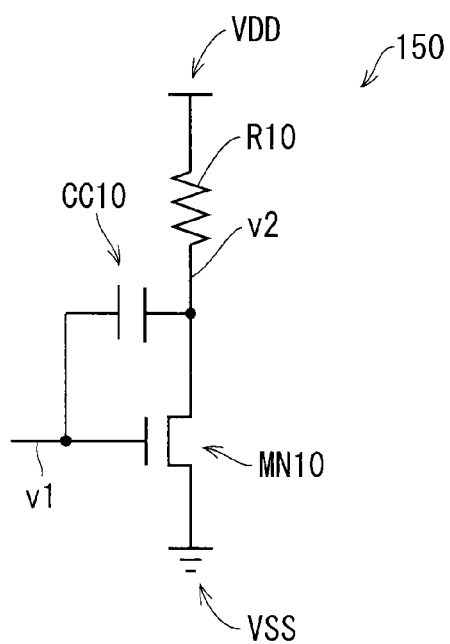
FIG. 10 is a diagram for illustrating the Miller effect.

The expression (38) shows that, if r20×gmMNUR=1, the phase compensation capacitive element CC1 can obtain the Miller effect similar to that received by the capacitive element CC10 of FIG. 10. In other words, if the characteristics of the NMOS transistor MNUR are adjusted to satisfy r20×gmMNUR 1, it can be regarded that the control terminal CSUc of the current source CSU is connected to a capacitive element having a capacitance value that is obtained by multiplying the capacitance value of the phase compensation capacitive element CC1 by the gain A20.

In this way, the fourth comparative circuit 140 reduces the likelihood of the current Iss (amplitude VOD) being limited due to the operating point of the phase compensation capacitive element CC1, and allows the phase compensation capacitive element CC1 to obtain the Miller effect.

However, the presence of the cascode circuit consisting of the NMOS transistors MNUR and MNLR between the output terminal OUT and the ground potential VSS can possibly prevent the setting of the lower limit of the control potential Vcnt from being reduced to a minimum value that is determined based on the operating point of the current source CSU.

Assuming that VdsN1_sat is the magnitude of the drain-source voltage required for the NMOS transistor MNLR to operate in the saturation region and VdsN2_sat is the magnitude of the drain-source voltage required for the NMOS transistor MNUR to operate in the saturation region, the control potential Vcnt is higher than a value that is obtained by adding VdsN1_sat and VdsN2_sat, as given by the following expression (39).

$$Vcnt > VdsN1\_sat + VdsN2\_sat \quad (39)$$

Here, the above expression (22) for determining the operating point of the current source CSU can be modified into the following expression (40).

$$Vcnt > VH - |VthCSU| \quad (40)$$

From the expressions (39) and (40), if the following expression (41) is satisfied, the setting of the minimum value of the control potential Vcnt is limited due to the presence of the cascode circuit and cannot be reduced to the minimum value that is determined based on the operating point of the current source CSU.

$$VdsN1\_sat + VdsN2\_sat > VH - |VthCSU| \quad (41)$$

Accordingly, it is difficult in the fourth comparative circuit 140 to increase the current Iss and consequently to increase the amplitude VOD of the output differential signal.

In this way, in the fourth comparative circuit 140 in which the cascode circuit is included in the output stage of the operational amplifier 300, it is difficult to expand the output range of the operational amplifier 300.

In view of the above, the present preferred embodiment provides a semiconductor circuit that is capable of easily expanding the output range of an amplifier circuit such as an operational amplifier and improving the area efficiency of a phase compensation capacitive element.

Detailed Description of Semiconductor Circuit of Preferred Embodiment

FIG. 12 illustrates configurations of the driver circuit 4 and the amplifier circuit 3 in the semiconductor circuit 1 according to the present preferred embodiment. The amplifier circuit 3 of the present preferred embodiment is, for example, an operational amplifier. Hereinafter, the amplifier circuit 3 may also be referred to as an "operational amplifier 3."

The driver circuit 4 of the present preferred embodiment has the same configuration as the above-described driver circuit 400. The bias circuit 2 (see FIG. 1) of the present preferred embodiment has the same configuration as the above-described bias circuit 200. The following description focuses on differences of the semiconductor circuit 1 of the present preferred embodiment from the above-described fourth comparative circuit 140.

One end of the phase compensation capacitive element CC is connected to an output terminal CSUo of a current source CSU. The other end of the phase compensation capacitive element CC is connected to a feedback terminal FP of the operational amplifier 3. A feedback potential FB that is fed back from the driver circuit 4 to the operational amplifier 3 corresponds to the feedback signal FS in FIG. 1, and a control potential Vcnt that is output from the operational amplifier 3 corresponds to the control signal CS in FIG. 1.

FIG. 13 illustrates configurations of the driver circuit 4 and the amplifier circuit 3 when the phase compensation capacitive element CC is an NMOS transistor MNCC, the current source CSU is a PMOS transistor MPCSU, and the current source CSL is an NMOS transistor MNCSL as shown in FIG. 3.

As illustrated in FIG. 13, the gate of the NMOS transistor MNCC constituting the phase compensation capacitive element CC is connected to the output terminal CSUo of the current source CSU. The drain and source of the NMOS transistor MNCC are connected to each other and are also connected to the feedback terminal FP of the operational amplifier 3.

Figure 14:
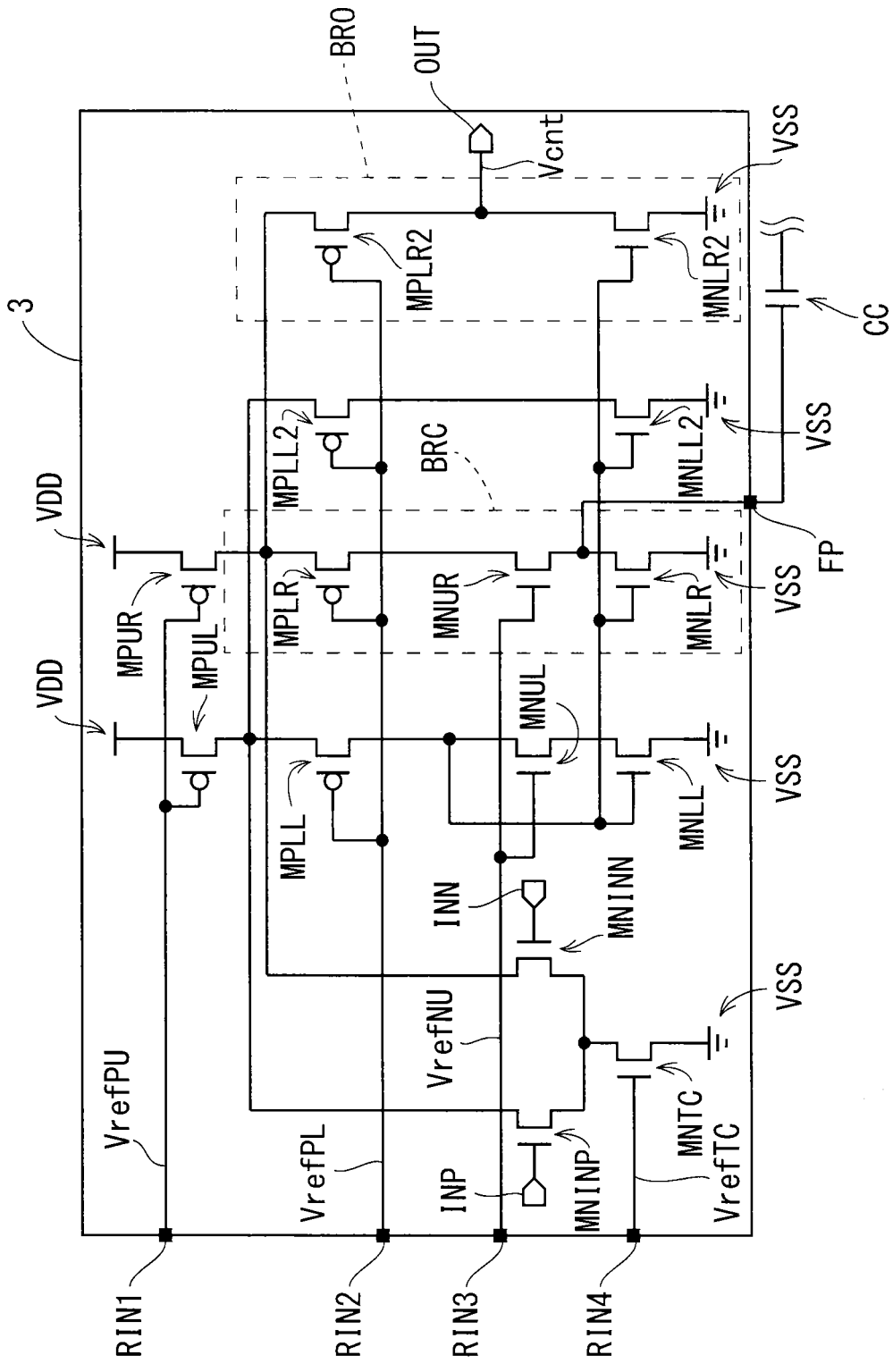
FIG. 14 illustrates a configuration of an amplifier circuit of the semiconductor circuit.

FIG. 14 illustrates a configuration of the operational amplifier 3 according to the present preferred embodiment. The operational amplifier 3 of the present preferred embodiment is obtained by adding PMOS transistors MPLL2 and MPLR2 and NMOS transistors MNLL2 and MNLR2 to the operational amplifier 300 in FIG. 8. The following description focuses on differences of the operational amplifier 3 from the operational amplifier 300.

The sources of the PMOS transistors MPLL2 and MPLR2 are respectively connected to the drains of the NMOS transistors MNINP and MNINN in the input stage. The gates of the PMOS transistors MPLL2 and MPLR2 are connected to each other and are also connected to the gates of the PMOS transistors MPLL and MPLR. The drains of the PMOS transistors MPLL2 and MPLR2 are respectively connected to the drains of the NMOS transistors MNLL2 and MNLR2. The sources of the NMOS transistors MNLL2 and MNLR2 are connected to the ground potential VSS. The gates of the NMOS transistors MNLL2 and MNLR2 are connected to each other and are also connected to the gates of the NMOS transistors MNLL and MNLR.

Unlike the above-described operational amplifier 300, the operational amplifier 3 of the present preferred embodiment has the output terminal OUT connected to the drains of the PMOS transistor MPLR2 and the NMOS transistor MNLR2. Thus, a potential at the drains of the PMOS transistor MPLR2 and the NMOS transistor MNLR2 is output as the control potential Vcnt from the output terminal OUT.

Like the operational amplifier 300, the operational amplifier 3 of the present preferred embodiment has the feedback terminal FP connected to the source of the NMOS transistor MNUR and the drain of the NMOS transistor MNLR. Thus, the one end of the phase compensation capacitive element CC is connected to the source of the NMOS transistor MNUR and the drain of the NMOS transistor MNLR.

As can be understood from the above description, in the operational amplifier 3 of the present preferred embodiment, an output branch BRO that outputs the control potential Vent is connected in parallel to a branch BRC for phase compensation that is connected to the feedback terminal FP. The branch BRC for phase compensation includes a cascode circuit constituted by the NMOS transistors MNUR and MNLR.

In the semiconductor circuit 1 of the present preferred embodiment, as in the fourth comparative circuit 140, the one end of the phase compensation capacitive element CC is connected not to the output terminal OUT but to the source of the NMOS transistor MNUR and the drain of the NMOS transistor MNLR. This reduces the likelihood of the current Iss (amplitude VOD) being limited due to the operating point of the phase compensation capacitive element CC, as in the case of the fourth comparative circuit 140.

Figure 15:
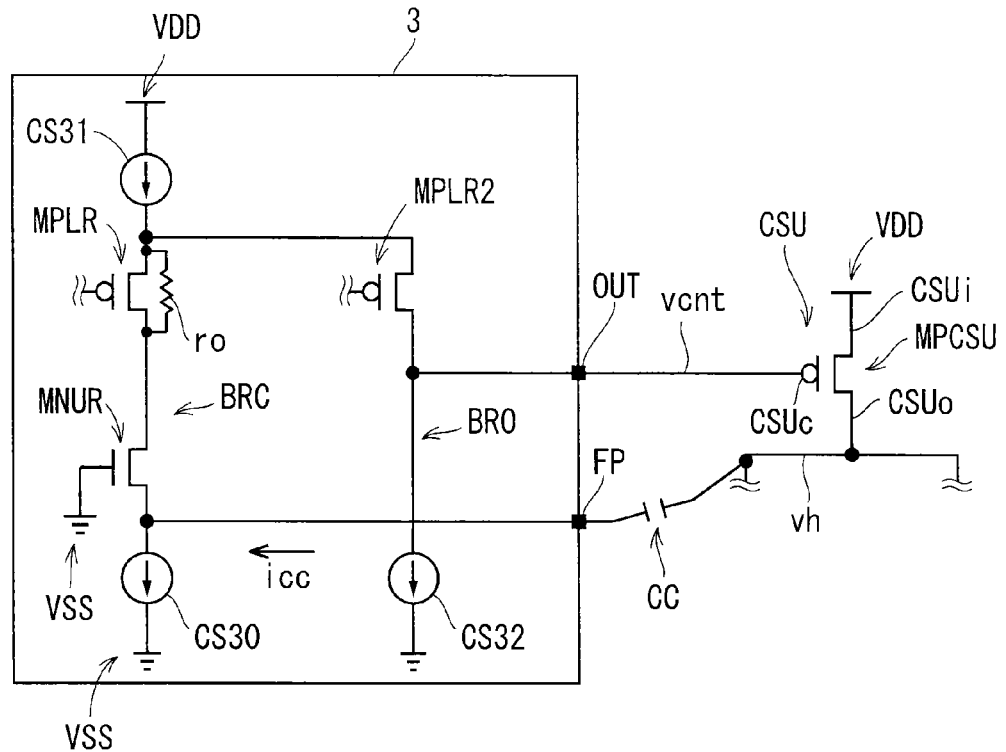
FIG. 15 illustrates a small-signal equivalent circuit of part of the semiconductor circuit.

Additionally, the phase compensation capacitive element CC in the semiconductor circuit 1 can obtain the Miller effect, as in the fourth comparative circuit 140. FIG. 15 illustrates a small-signal equivalent circuit of part of the semiconductor circuit 1.

As illustrated in FIG. 15, in the small-signal equivalent circuit, the NMOS transistor MNLR of the branch BRC for phase compensation in the operational amplifier 3 can be regarded as a current source CS30, and the gate of the NMOS transistor MNUR in the branch BRC for phase compensation can be regarded as being grounded. Also, the PMOS transistor MPUR of the operational amplifier 3 can be regarded as a current source CS31 in the small-signal equivalent circuit. The NMOS transistor MNLR2 of the output branch BRO in the operational amplifier 3 can be regarded as a current source CS32 in the small-signal equivalent circuit.

In the circuit illustrated in FIG. 15, as in the circuit illustrated in FIG. 11, the small-signal current icc flowing through the phase compensation capacitive element CC flows through the NMOS transistor MNUR and the PMOS transistors MPLR and MPLR2 to the gate of the PMOS transistor MPCSU constituting the current source CSU. Thus, the phase compensation capacitive element CC can obtain the Miller effect. Note that the small-signal current icc flowing through the PMOS transistor MPLR can be thought of as flowing through a source-drain resistor ro in channel-length modulation.

In the present preferred embodiment, there is no cascode circuit in the output branch BRO of the operational amplifier 3, and therefore, it is possible to easily expand the output range of the operational amplifier 3.

Figure 16:
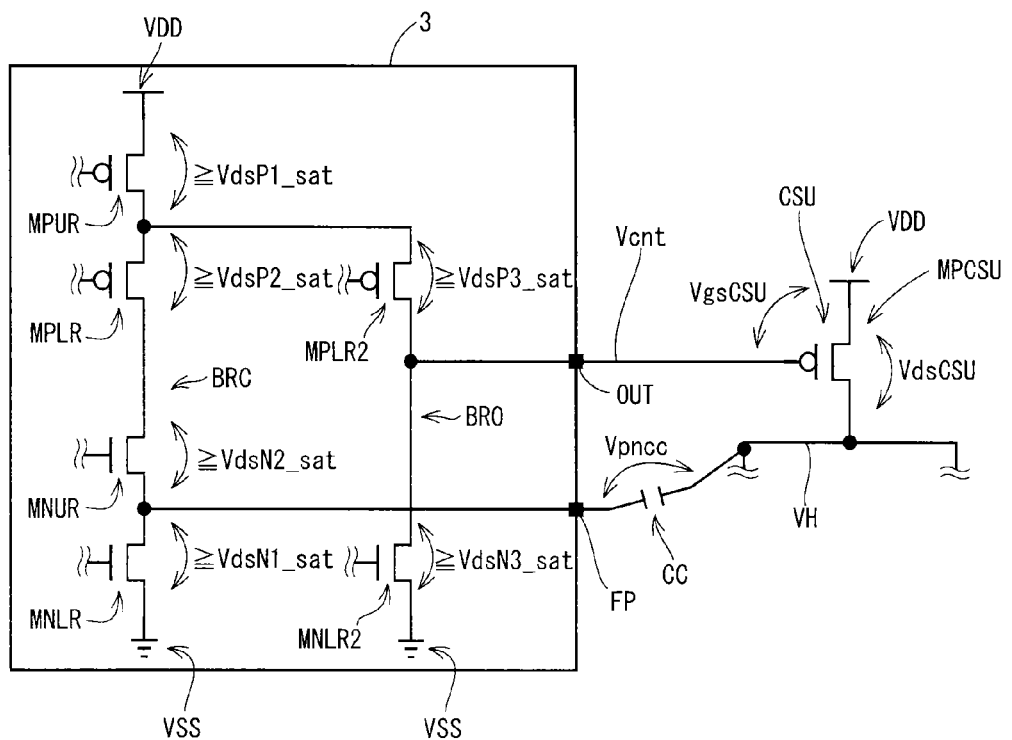
FIG. 16 illustrates various potentials and voltages in the semiconductor circuit.

FIG. 16 illustrates potentials and voltages in the circuits around the phase compensation capacitive element CC in the semiconductor circuit 1. A voltage VdsP1_sat indicates the magnitude of a drain-source voltage that is required for the PMOS transistor MPUR to operate in the saturation region, and a voltage VdsP2_sat indicates the magnitude of a drain-source voltage that is required for the PMOS transistor MPLR to operate in the saturation region. A voltage VdsP3_sat indicates the magnitude of a drain-source voltage that is required for the PMOS transistor MPLR2 to operate in the saturation region, and a voltage VdsN3_sat indicates the magnitude of a drain-source voltage that is required for the NMOS transistor MNLR2 to operate in the saturation region.

Figure 17:
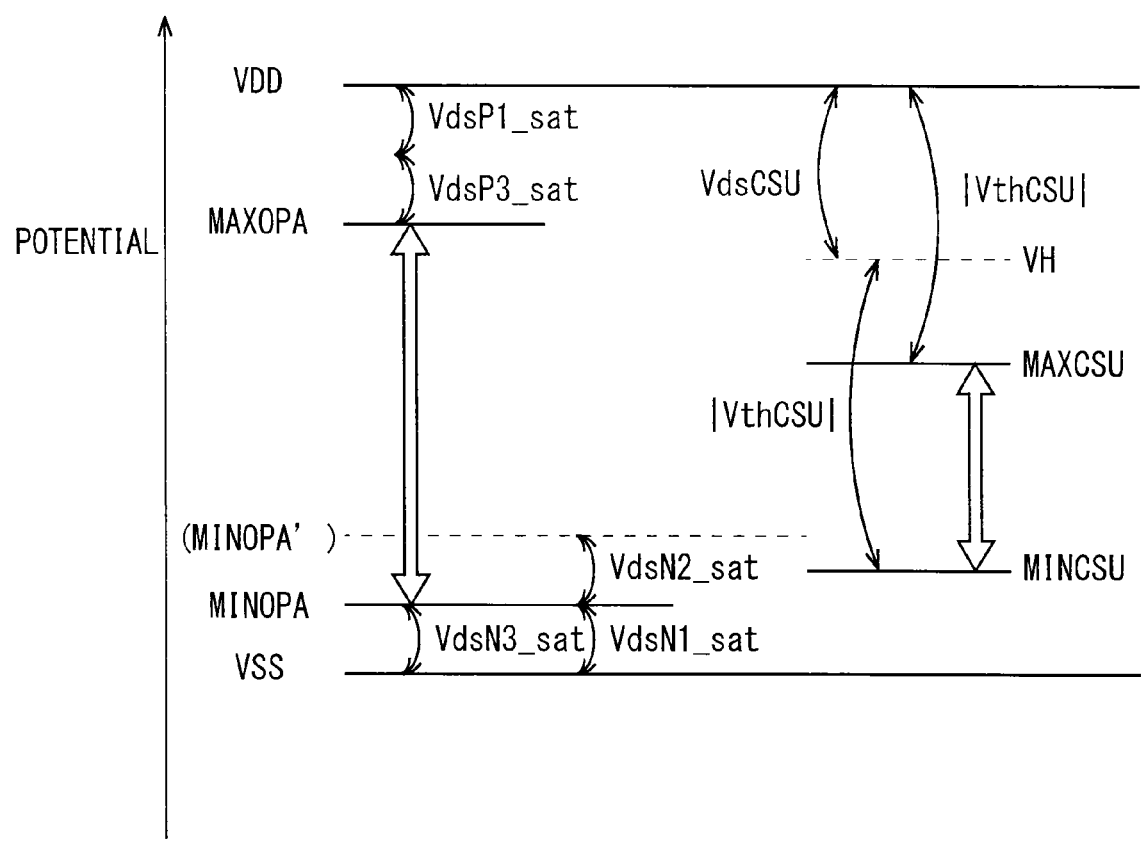
FIG. 17 illustrates a relationship between the various potentials and voltages in the semiconductor circuit.

FIG. 17 illustrates a relationship between maximum and minimum values MINOPA and MAXOPA of the control potential Vcnt that are determined based on the operating point of the operational amplifier 3 and maximum and minimum values MINCSU and MAXCSU of the control potential Vcnt that are determined based on the operating point of the current source CSU.

The operational amplifier 3 has the PMOS transistors MPUR and MPLR2 between the output terminal OUT and the positive power supply potential VDD. Thus, the maximum value MAXOPA is (VDD−VdsP1_sat−VdsP3_sat) as illustrated in FIG. 17. Also, the operational amplifier 3 has the NMOS transistor MNLR2 between the output terminal OUT and the ground potential VSS. Thus, the minimum value MINOPA is VdsN3_sat as illustrated in FIG. 17.

Regarding the current source CSU, the maximum value MAXCSU is (VDD−|VthCSU|) from the above expression (23) as illustrated in FIG. 17. The minimum value MINCSU is (VH−|VthCSU|) from the expression (22).

In this way, in the semiconductor circuit 1 of the present preferred embodiment, the minimum value MINOPA of the control potential Vcnt that is determined based on the operating point of the operational amplifier 3 is VdsN3_sat, and the minimum value MINCSU of the control potential Vcnt that is determined based on the operating point of the current source CSU is (VH−|VthCSU|). Thus, when the following expression (42) is satisfied, the minimum value of the control potential Vcnt can be set to the minimum value MINCSU that is determined based on the operating point of the current source CSU (strictly speaking, since Vcnt>VH−|VthCSU|, the minimum value of the control potential Vcnt can be reduced to near the minimum value MINCSU).

$$VH-|VthCSU| \geq VdsN3\_sat \quad (42)$$

Here, in the case of the operational amplifier 300 of the above-described fourth comparative circuit 140 that has the two NMOS transistors MNUL and MNLR between the output terminal OUT and the ground potential VSS, the minimum value MINOPA' of the control potential Vcnt that is determined based on the operating point of the operational amplifier 300 is (VdsN1_sat+VdsN2_sat) as illustrated in FIG. 17. Assuming that VdsN1_sat is the same as VdsN3_sat, the minimum value MINOPA in the semiconductor circuit 1 of the present preferred embodiment is smaller by VdsN2_sat than the minimum value MINOPA' in the fourth comparative circuit 140. In other words, the minimum value MINOPA can be reduced from the minimum value MINOPA' by the magnitude of the source-drain voltage required for the MOS transistor to operate in the saturation region. It is thus easier in the semiconductor circuit 1 of the present preferred embodiment to set the minimum value MINOPA to less than or equal to the minimum value MINCSU than in the fourth comparative circuit 140. In other words, the expression (42) can be easily satisfied.

For example, assume that VDD=1.8V±10%, VOC=0.9 V, |VthCSU|=0.8 V, VdsN1_sat=VdsN2_sat=VdsN3_sat=0.2 V, and |VOD|=0.4 V. If the positive power supply potential VDD takes the minimum value, i.e., 1.62 V, the maximum values MAXOPA and MAXCSU and the minimum values MINOPA, MINOPA', and MINCSU are as follows. Note that the potential VH is obtained from VH=VOC+|VOD|/2.

$$MAXCSU=1.62-0.8=0.82 \text{ V}$$

$$MAXOPA=1.62-0.2-0.2=1.22 \text{ V}$$

$$MINCSU=0.9+0.4/2-0.8=0.3 \text{ V}$$

$$MINOPA=0.2 \text{ V}$$

$$MINOPA'=0.2+0.2=0.4 \text{ V}$$

In the above numerical example, MINOPA'>MINCSU>MINOPA is satisfied as in FIG. 17. In this numerical example, the set minimum value of the control potential Vcnt in the fourth comparative circuit 140 is limited due to the operating point of the operational amplifier 3, but the present preferred embodiment eliminates this limitation and can reduce the set minimum value of the control potential Vcnt to the minimum value MINCSU that is determined based on the operating point of the current source CSU.

As described above, in the present preferred embodiment, the output branch BRO of the operational amplifier 3 includes the NMOS transistor MNLR2 in which the control potential Vcnt is output from one current terminal and the other current terminal is connected to the ground potential VSS. Thus, the output range of the operational amplifier 3, that is, the range of the control potential Vcnt, can be easily expanded. This makes it easy to increase the current Iss and thereby to increase the amplitude VOD of the output differential signal.

In addition, the phase compensation capacitive element CC that obtains the Miller effect is connected between the driver circuit 4 and the two connected current terminals of the NMOS transistors MNUR and MNLR that are included in the cascode circuit of the branch BRC for phase compensation. It is thus possible to improve the area efficiency of the phase compensation capacitive element CC and to increase the amplitude VOD.

The phase compensation capacitive element CC is not connected to the output terminals Txp and Txm of the driver circuit 4, and thus any influence that the phase compensation capacitive element CC has on the output characteristics of the driver circuit 4 can be suppressed.

Figure 18:
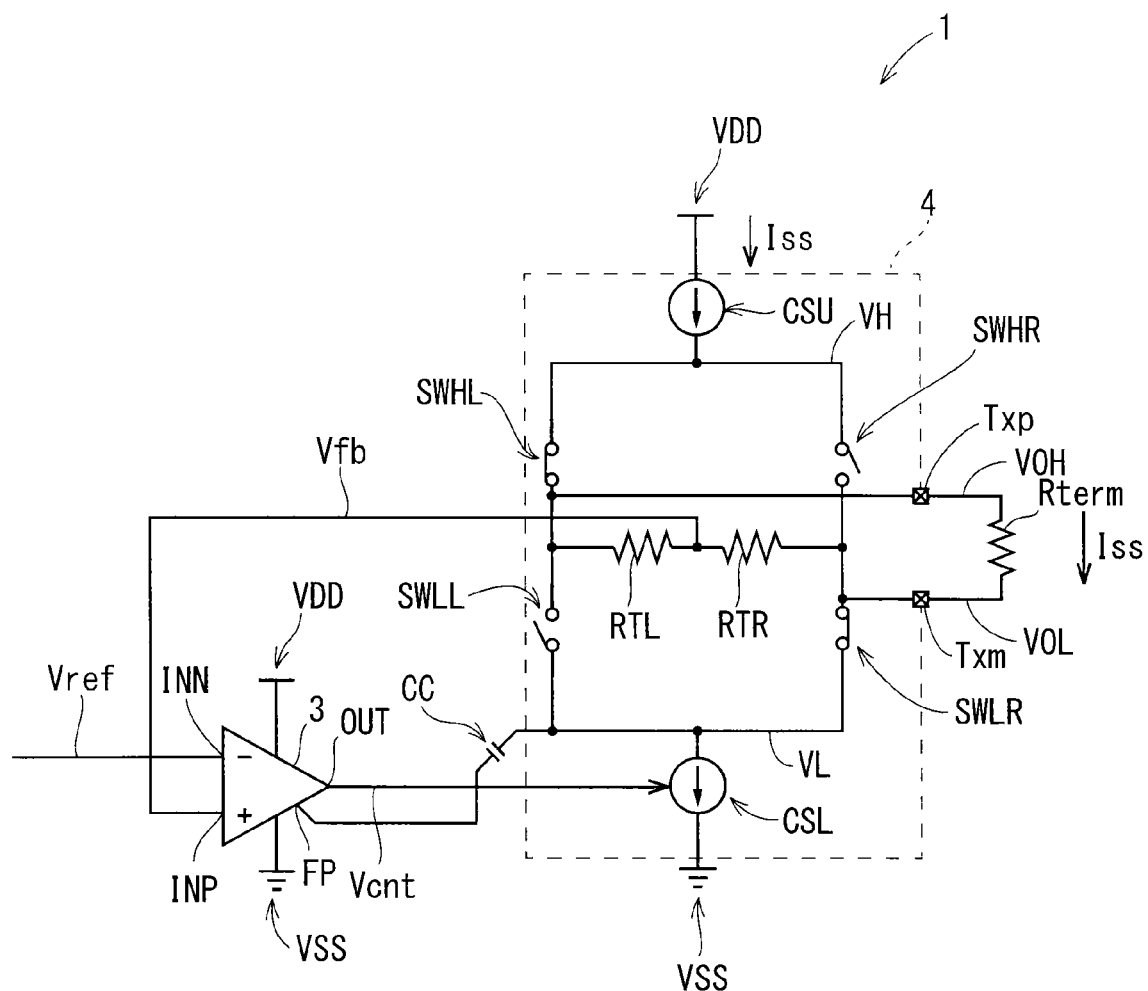
FIG. 18 illustrates a configuration of part of a semiconductor circuit according to a variation.

While the operational amplifier 3 controls the high potential-side current source CSU in the above-described example, it may control the low potential-side current source CSL as illustrated in FIG. 18.

While the driver circuit 4 in the above example includes the current sources CSU and CSL, it may instead include voltage sources. In this case, the operational amplifier 3 controls output potentials of the voltage sources, using the control potential Vcnt.

While the feedback potential Vfb that is fed back from the driver circuit 4 to the operational amplifier 3 is used as the common-mode potential VOC in the above example, it may be used as other potentials generated within the driver circuit 4. For example, the feedback potential Vfb may be the potential VH, the potential VOH, the potential VL, or the potential VOL.

While the cascode circuit of the branch BRC for phase compensation in the operational amplifier 3 is constituted by two stages of MOS transistors in the above example, it may be constituted by three or more stages of MOS transistors.

While the operational amplifier 3 includes another branch that includes the PMOS transistor MPLL2 and the NMOS transistor MNLL2 and forms a pair with the output branch BRO, it may not include such a branch. Also, the differential input of the operational amplifier 3 may be a single-end input.

While the semiconductor circuit 1 has been shown and described in detail, the foregoing description is in all aspects illustrative and is thus not intended to limit the present invention. Various modifications described above can be combined in applications as long as there are no mutual inconsistencies. It is therefore to be understood that numerous modifications and variations can be devised without departing from the scope of the invention.

What is claimed is:

1. A semiconductor circuit comprising:
    a control target circuit;
    an amplifier circuit that outputs a control signal for controlling the control target circuit and to which a feedback signal from the control target circuit is input; and the amplifier circuit and the control target circuit constituting a feedback loop that includes a plurality of poles,
    a semiconductor capacitive element for a phase compensation in the feedback loop, wherein the amplifier circuit includes:
        an output branch including a first transistor having a first current terminal from which the control signal is output and a second current terminal that is connected to a power supply potential; and
        a branch that is connected in parallel to the output branch and includes a cascode circuit,
        the cascode circuit includes a second transistor having third and fourth current terminals, and a third transistor having fifth and sixth current terminals,
        the fourth current terminal and the fifth current terminals are connected to each other, and the semiconductor capacitive element that obtains a Miller effect is connected between the control target circuit and the fourth and fifth current terminals.

2. The semiconductor circuit according to claim 1, wherein the output branch further includes a fourth transistor having seventh and eighth current terminals, the seventh current terminal being connected to the first current terminal of the first transistor, the branch including the cascode circuit further includes a fifth transistor having ninth and tenth current terminals, the ninth current terminal being connected to the third current terminal of the second transistor, and the eighth current terminal of the fourth transistor and the tenth current terminal of the fifth transistor are connected to each other.

3. The semiconductor circuit according to claim 1, wherein the control target circuit is a driver circuit that drives a load, and the amplifier circuit controls an output of the driver circuit.

4. The semiconductor circuit according to claim 3, wherein the driver circuit includes a current source or voltage source for controlling the output of the driver circuit, and the amplifier circuit outputs the control signal to a control terminal of the current source or the voltage source.

5. The semiconductor circuit according to claim 4, wherein the output of the driver circuit is a differential output, and the feedback signal is one output potential of the differential output, the other output potential of the differential output, or an intermediate potential of the differential output.

6. The semiconductor circuit according to claim 4, wherein the driver circuit further includes a switching circuit between an output terminal of the driver circuit and the current source or the voltage source, and one end of the semiconductor capacitive element is connected to a terminal of the current source or the voltage source, the terminal being on a side of the switching circuit.

7. The semiconductor circuit according to claim 3, wherein the driver circuit includes:

a differential output terminal having first and second output terminals;

high potential-side first and second switching devices; and low potential-side third and fourth switching devices, one end of the high potential-side first switching device and one end of the high potential-side second switching device are connected to each other, one end of the low potential-side third switching device and one end of the low potential-side fourth switching device are connected to each other, the other end of the high potential-side first switching device and the other end of the low potential-side third switching device are connected to the first output terminal, and the other end of the high potential-side second switching device and the other end of the low potential-side fourth switching device are connected to the second output terminal.

8. An amplifier circuit that is included in the semiconductor circuit according to claim 1.

* * * * *